(12) United States Patent
Shim et al.

(10) Patent No.: US 10,386,978 B2
(45) Date of Patent: Aug. 20, 2019

(54) DISPLAY APPARATUS

(71) Applicant: Samsung Display Co., Ltd., Yongin-si (KR)

(72) Inventors: Donghwan Shim, Hwaseong-si (KR); Taehyun Kim, Seoul (KR); Seungmin Lee, Hwaseong-si (KR); Seung-hwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 15/802,403

(22) Filed: Nov. 2, 2017

(65) Prior Publication Data

US 2018/0120977 A1    May 3, 2018

(30) Foreign Application Priority Data

Nov. 3, 2016  (KR) .................. 10-2016-0145961

(51) Int. Cl.
*G06F 3/044* (2006.01)
*G02F 1/1333* (2006.01)
(Continued)

(52) U.S. Cl.
CPC .......... *G06F 3/044* (2013.01); *G02F 1/13338* (2013.01); *G02F 1/136213* (2013.01);
(Continued)

(58) Field of Classification Search
CPC ...... G06F 3/044; G06F 3/0412; G06F 1/1652; G06F 2203/04112; G06F 2203/04111;
(Continued)

(56) References Cited

U.S. PATENT DOCUMENTS 9,397,194 B2    7/2016  Yamazaki et al.
2014/0168138 A1*  6/2014  Kuo ..................... G06F 3/0412
                                                        345/174
(Continued)

FOREIGN PATENT DOCUMENTS

KR       10-1401053         5/2014
KR       10-2014-0076991    6/2014
WO       WO 2017150913 A1 *  9/2017  ........... H01L 25/075

*Primary Examiner* — Nicholas J Lee
*Assistant Examiner* — Gerald L Oliver
(74) *Attorney, Agent, or Firm* — H.C. Park & Associates, PLC

(57) ABSTRACT

A display apparatus includes a display panel (DP) and a sensor unit on the DP. The sensor unit includes: a first conductive layer (CL) including a first bridge (FB); a second CL disposed on the first CL, the second CL including first sensor portions (FSPs) spaced apart from each other and arranged in a first direction; a first insulating layer (IL) disposed between the first CL and the second CL, the first IL including through-holes (THs) extending between the FB and the FSPs overlapping the FB; and contact electrodes (CEs) filling spaces defined by a bridge top surface of the FB exposed by the THs, insulating sidewalls of the first IL defining the THs, and sensor bottom surfaces of the FSPs facing the FB. A cross-section, which is perpendicular to a top surface of the DP, of each of the CEs has a polygonal shape of five or more sides.

20 Claims, 17 Drawing Sheets

(51) Int. Cl.
*G02F 1/1362* (2006.01)
*G06F 1/16* (2006.01)
*G06F 3/041* (2006.01)
*H01B 5/14* (2006.01)
*H01L 29/786* (2006.01)
*H01L 29/417* (2006.01)

(52) U.S. Cl.
CPC .......... *G06F 1/1652* (2013.01); *G06F 3/0412* (2013.01); *H01B 5/14* (2013.01); *H01L 29/786* (2013.01); *G06F 2203/04102* (2013.01); *G06F 2203/04111* (2013.01); *G06F 2203/04112* (2013.01); *H01L 29/41733* (2013.01)

(58) Field of Classification Search
CPC ....... G06F 2203/04102; G02F 1/13338; G02F 1/136213; H01B 5/14; H01L 29/41733
See application file for complete search history.

(56) References Cited

U.S. PATENT DOCUMENTS

| | | | |
|---|---|---|---|
| 2014/0333578 A1* | 11/2014 | Wu | G06F 3/041 345/174 |
| 2015/0022731 A1* | 1/2015 | Kang | G06F 3/044 349/12 |
| 2015/0107978 A1* | 4/2015 | Han | G06F 3/044 200/5 R |
| 2018/0032190 A1* | 2/2018 | Koide | G06F 3/0416 |

\* cited by examiner

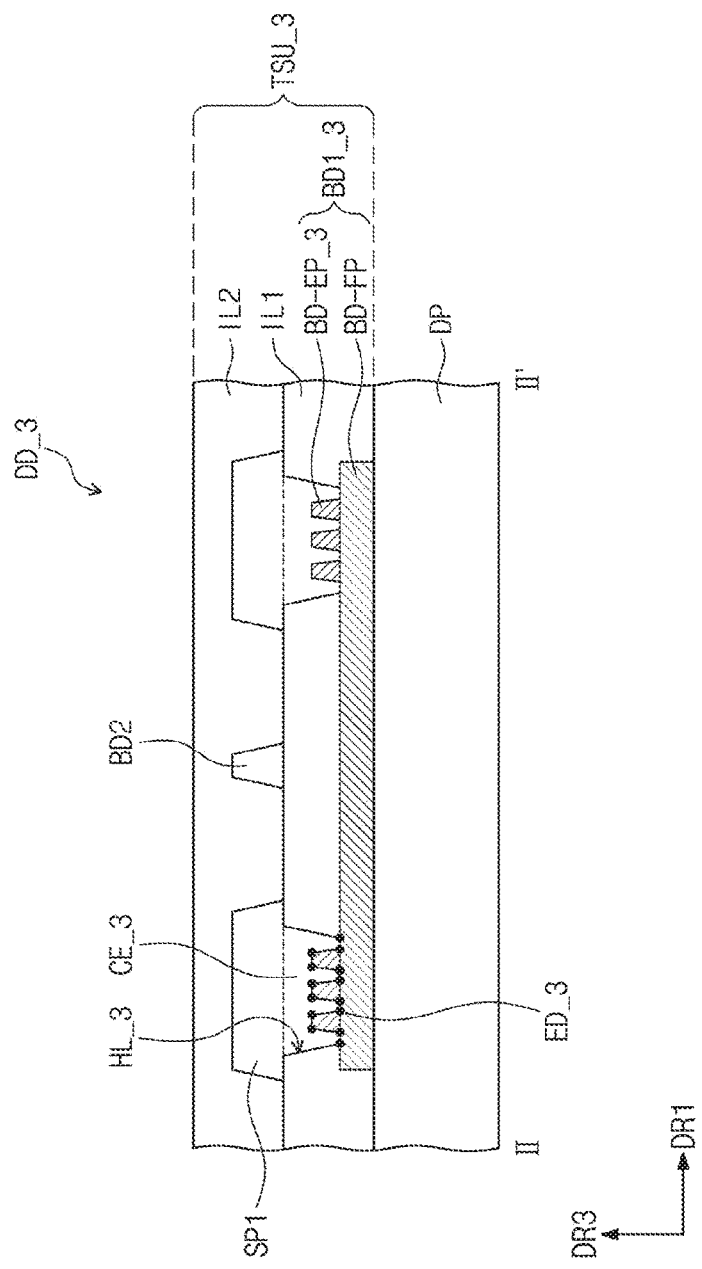

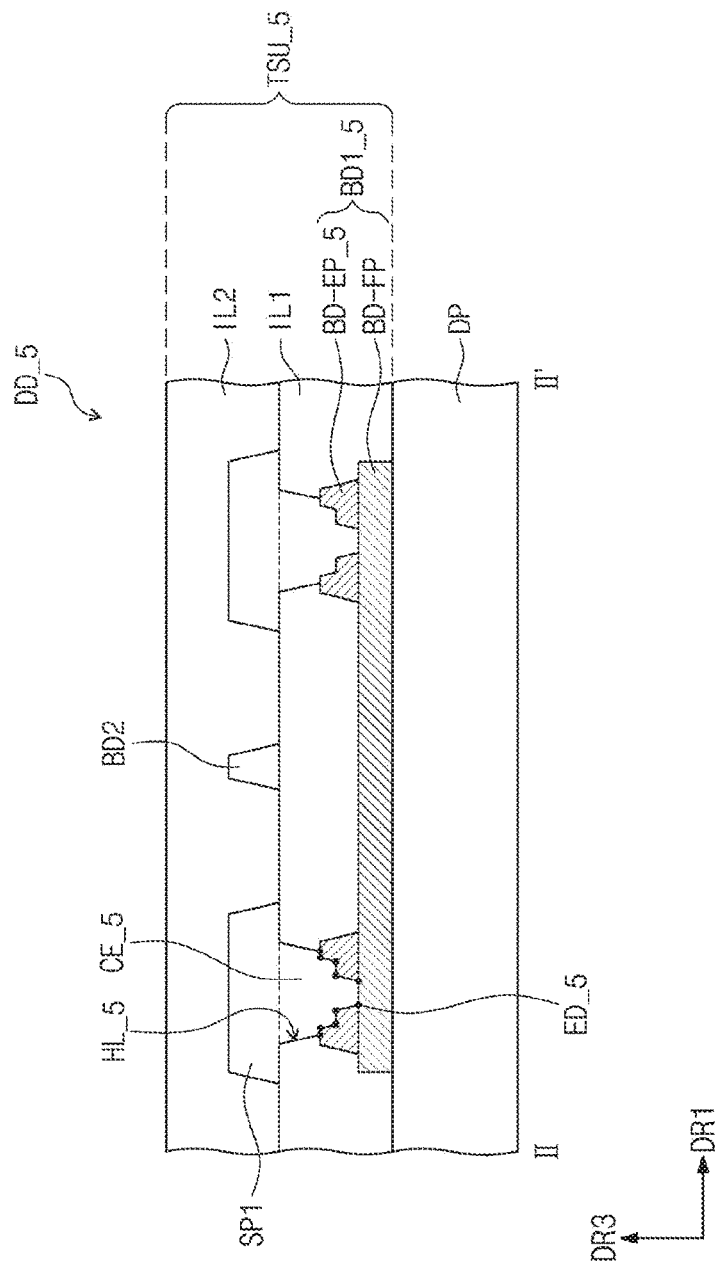

DISPLAY APPARATUS

CROSS-REFERENCE TO RELATED APPLICATION

This application claims priority from and the benefit of Korean Patent Application No. 10-2016-0145961, filed Nov. 3, 2016, which is hereby incorporated by reference for all purposes as if fully set forth herein.

BACKGROUND

Field

Exemplary embodiments relate to a display apparatus. More particularly, exemplary embodiments relate to a display apparatus that includes a sensor unit having a contact electrode capable of reducing a contact resistance.

Discussion

Various types of display devices may be used in multimedia devices, such as televisions, portable phones, tablet computers, navigation systems, game consoles, etc. Input units (or interfaces) of a display device may include a keyboard, mouse, and/or the like. A display device may additionally or alternatively include a touch sensing unit as an input unit.

The above information disclosed in this section is only for understanding the background of the inventive concepts, and, therefore, may contain information that does not form prior art.

SUMMARY

Some exemplary embodiments provide a display apparatus including a contact electrode capable of reducing a contact resistance between a bridge and a sensor portion of a sensing electrode.

Additional aspects will be set forth in the detailed description which follows, and, in part, will be apparent from the disclosure, or may be learned by practice of the inventive concepts.

According to some exemplary embodiments, a display apparatus includes a display panel and a sensor unit disposed on the display panel. The sensor unit includes a first conductive layer; a second conductive layer; a first insulating layer; and contact electrodes. The first conductive layer includes a first bridge. The second conductive layer is disposed on the first conductive layer. The second conductive layer includes first sensor portions spaced apart from each other and arranged in a first direction. The first insulating layer is disposed between the first conductive layer and the second conductive layer. The first insulating layer includes through-holes extending between the first bridge and the first sensor portions overlapping the first bridge. The contact electrodes fill spaces defined by a bridge top surface of the first bridge exposed by the through-holes, insulating sidewalls of the first insulating layer defining the through-holes, and sensor bottom surfaces of the first sensor portions facing the first bridge. A cross-section, which is perpendicular to a top surface of the display panel, of each of the contact electrodes has a polygonal shape of five or more sides.

The second conductive layer may further include: second sensor portions spaced apart from each other and arranged in a second direction intersecting the first direction; and a second bridge connecting adjacent second sensor portions among the second sensor portions.

The display panel may include: a base substrate; a circuit layer disposed on the base substrate; a light-emitting device layer disposed on the circuit layer; and a sealing layer disposed on the light-emitting device layer. The first conductive layer may be disposed directly on the sealing layer.

The first bridge may include: a bridge flat portion extending in the first direction; and a bridge protrusion disposed on the bridge flat portion.

The polygonal shape may be defined by a top surface of the bridge flat portion, a sidewall and a top surface of the bridge protrusion, an insulating sidewall among the insulating sidewalls, and a sensor bottom surface among the sensor bottom surfaces.

The bridge protrusion may be disposed on an end portion of the bridge flat portion. A portion of the sidewall and a portion of the top surface of the bridge protrusion may be disposed in a through-hole among the through-holes.

The bridge protrusion may be one of a plurality of bridge protrusions. First bridge protrusions among the plurality of bridge protrusions may be disposed on a first end portion of the bridge flat portion. Second bridge protrusions among the plurality of bridge protrusions may be disposed on a second end portion of the bridge flat portion, the second end portion opposing the first end portion. A portion of a sidewall and a portion of a top surface of each of the plurality of bridge protrusions may be disposed in a corresponding through-hole among the through-holes.

The bridge flat portion and the bridge protrusion may include different conductive metals.

The first bridge may include a bridge concave portion exposing the top surface of the display panel.

The polygonal shape may be defined by the exposed top surface of the display panel, a sidewall of the first bridge defining the bridge concave portion, the bridge top surface, an insulating sidewall among the insulating sidewalls, and a sensor bottom surface among the sensor bottom surfaces.

The bridge concave portion may be defined in a through-hole among the through-holes.

The display panel may include a recessed portion disposed at a position corresponding to the bridge concave portion.

The polygonal shape may be defined by a top surface of the display panel exposed by the recessed portion, a sidewall of the first bridge defining the bridge concave portion, the bridge top surface, an insulating sidewall among the insulating sidewalls, and a sensor bottom surface among the sensor bottom surfaces.

The sensor unit may further include a second insulating layer disposed on the second conductive layer.

Adjacent first sensor portions among the first sensor portions may be electrically connected to each other through the first bridge and the contact electrodes.

Each of the first bridge, the first sensor portions, the second bridge, the second sensor portions, and the contact electrodes may include a multi-layered electrode layer formed of two or more metal layers.

According to some exemplary embodiments, a display apparatus includes a display panel and a sensor unit disposed on the display panel. The sensor unit includes a first conductive layer, an insulating layer, a second conductive layer, and a contact electrode. The first conductive layer includes a first bridge. The first bridge includes at least one uneven portion. The insulating layer is disposed on the first conductive layer. The insulating layer includes a through-hole overlapping the at least one uneven portion. The second conductive layer is disposed on the insulating layer. The second conductive layer includes a first sensor portion overlapping the at least one uneven portion and the through-hole. The contact electrode is disposed on the at least one uneven portion. The contact electrode fills the through-hole.

The at least one uneven portion may be a concave portion or a protrusion.

A cross-section, which is perpendicular to a top surface of the display panel, of the concave portion or protrusion may have a trapezoidal shape.

The first sensor portion may be one of a plurality of first sensor portions. The plurality of first sensor portions may be spaced apart from each other and are arranged in a first direction. The second conductive layer further includes: second sensor portions spaced apart from each other and arranged in a second direction intersecting the first direction; and a second bridge connecting adjacent second sensor portions among the second sensor portions.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 12A, 12B, 12C, 12D, and 12E are cross-sectional views illustrating contact electrodes included in display apparatuses according to various exemplary embodiments.

DETAILED DESCRIPTION OF THE ILLUSTRATED EMBODIMENTS

Figure 1:
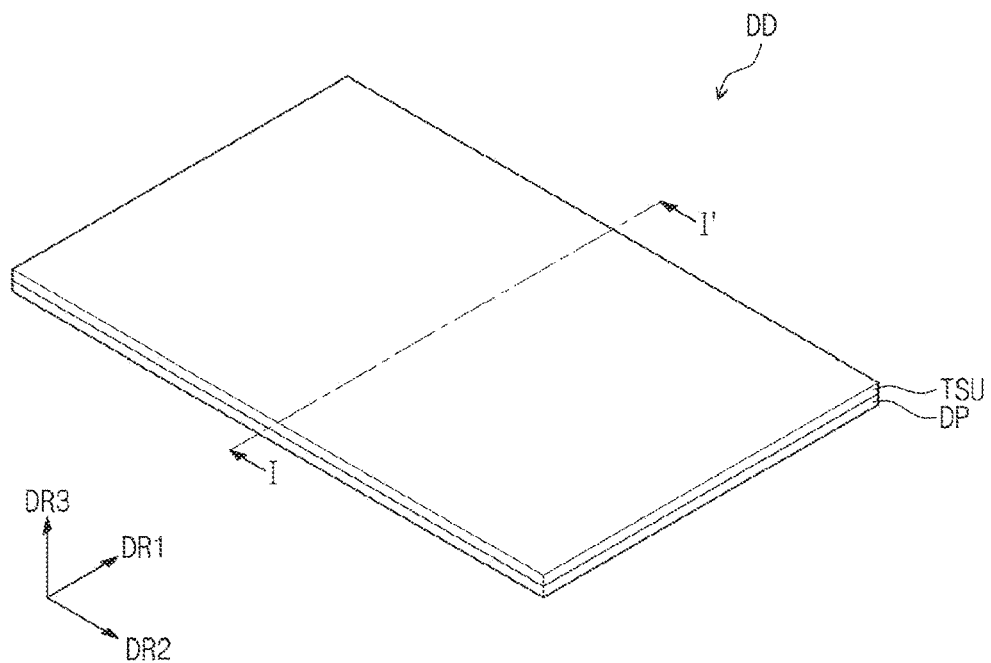
FIG. 1 is a perspective view illustrating a display apparatus according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
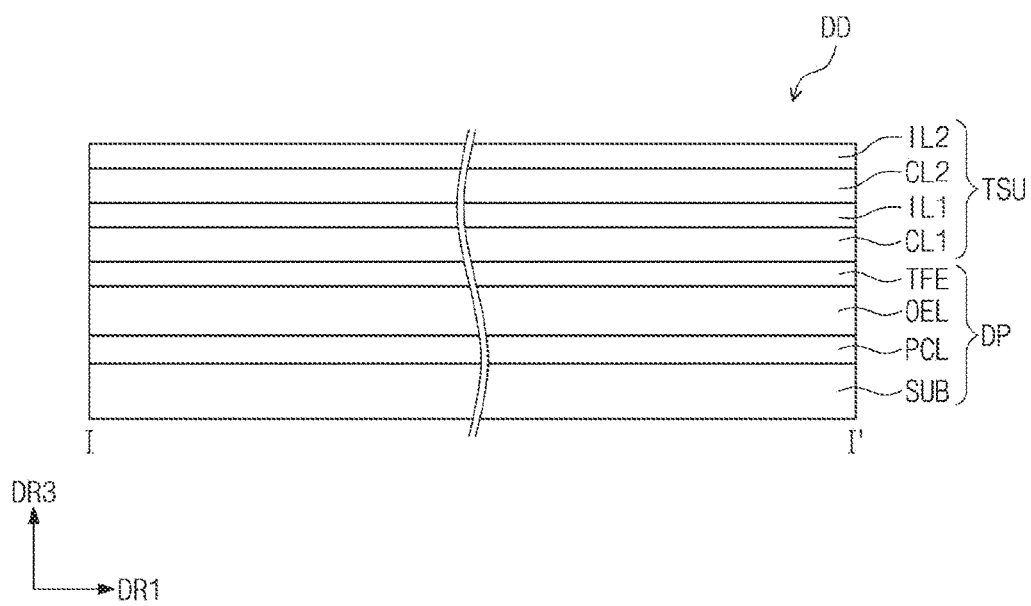
FIG. 2 is a cross-sectional view taken along sectional line I-I' of FIG. 1 according to some exemplary embodiments.

FIG. 1 is a perspective view illustrating a display apparatus DD according to some exemplary embodiments. FIG. 2 is a cross-sectional view taken along sectional line I-I' of FIG. 1 according to some exemplary embodiments.

Referring to FIGS. 1 and 2, a display apparatus DD may include a display panel DP and a sensor unit TSU. The sensor unit TSU may be provided on the display panel DP. The display panel DP may provide an image, and the sensor unit TSU may sense or recognize a direct touch of a user, an indirect touch of a user, a direct touch of an object, or an indirect touch of an object.

The sensor unit TSU may sense at least one of a position or a strength (e.g., pressure) of the touch provided from the outside. The sensor unit TSU according to some exemplary embodiments may have at least one of various structures and/or may be formed of at least one of various materials. However, exemplary embodiments are not limited to a specific structure and/or a specific material. For example, in the display apparatus DD according to some exemplary embodiments, the sensor unit TSU may be a touch sensing unit that senses an external touch.

Hereinafter, the display panel DP will be described as an organic light-emitting display panel as an example. However, exemplary embodiments are not limited thereto or thereby. In some exemplary embodiments, the display panel DP may be a liquid crystal display panel, a plasma display panel, an electrophoretic display panel, a microelectromechanical system (MEMS) display panel, an electrowetting display panel, etc.

FIG. 2 illustrates a schematic cross-sectional view of the display apparatus DD taken along sectional line I-I' according to some exemplary embodiments. As seen in FIG. 2, the display panel DP of the display apparatus DD may include a base substrate SUB, a circuit layer PCL disposed on the base substrate SUB, an organic electroluminescent device OEL (e.g., a light-emitting device layer) disposed on the circuit layer PCL, and a sealing layer TFE disposed on the organic electroluminescent device OEL.

The sealing layer TFE may protect the organic electroluminescent device OEL and may surround the organic electroluminescent device OEL. Although not illustrated, the sealing layer TFE may include a plurality of layers. For instance, the sealing layer TFE may include an inorganic layer and an organic layer. In some exemplary embodiments, the sealing layer TFE may include at least two inorganic layers and an organic layer disposed between the inorganic layers. The inorganic layer may protect the organic electroluminescent device OEL from moisture, oxygen, etc., and the organic layer may protect the organic electroluminescent device OEL from a foreign material, such as dust particles, and/or the like. The inorganic layer may include a silicon nitride layer, a silicon oxynitride layer, and/or a silicon oxide layer. The organic layer may include, but is not limited to, an acrylic-based organic material. The inorganic layer may be formed by a deposition method, and the organic layer may be formed by a coating process. However, exemplary embodiments are not limited thereto or thereby.

According to some exemplary embodiments, the display panel DP may be flexible. However, exemplary embodiments are not limited thereto or thereby. In some exemplary embodiments, the display panel DP may be rigid or may include at least one ridged portion and at least one flexible portion.

The sensor unit TSU may be disposed on the display panel DP. For instance, the sensor unit TSU may be disposed directly on the display panel DP. In some exemplary embodiments, an adhesive member (not shown) may be disposed between the sensor unit TSU and the display panel DP. In this manner, the adhesive member may be utilized to couple the sensor unit TSU and the display panel DP to one another.

In some exemplary embodiments, the sensor unit TSU may be disposed directly on the sealing layer TFE of the display panel DP. For example, the sensor unit TSU may be formed directly on the sealing layer TFE by a continuous process without an additional adhesive member. However, exemplary embodiments are not limited thereto or thereby. In some exemplary embodiments, a buffer layer (not shown) may be disposed on the sealing layer TFE, and the sensor unit TSU may be disposed on the buffer layer. The buffer layer may be an organic layer or an inorganic layer.

The sensor unit TSU may include a first conductive layer CL1, a first insulating layer IL1, a second conductive layer CL2, and a second insulating layer IL2. The first conductive layer CL1, the first insulating layer IL1, the second conductive layer CL2, and the second insulating layer IL2 may be sequentially stacked in a third direction DR3 corresponding to a thickness direction of the sensor unit TSU. On the other hand, the second insulating layer IL2 may be omitted from the sensor unit TSU.

Each of the first and second conductive layers CL1 and CL2 may have a single-layered structure or may have a multi-layered structure including a plurality of layers sequentially stacked in the third direction DR3. A conductive layer having the multi-layered structure may include at least two of transparent conductive layers and metal layers. In some exemplary embodiments, the conductive layer having the multi-layered structure may include metal layers including different metals from each other. The transparent conductive layer may include at least one of indium-tin oxide (ITO), indium-zinc oxide (IZO), zinc oxide (ZnO), indium-tin-zinc oxide (ITZO), PEDOT, metal nanowire, and graphene. The metal layer may include, for instance, molybdenum, silver, titanium, copper, aluminum, and/or any alloy thereof. For example, each of the first and second conductive layers CL1 and CL2 may have a three-layer structure of titanium/aluminum/titanium. However, exemplary embodiments are not limited thereto or thereby.

In some exemplary embodiments, each of the first and second conductive layers CL1 and CL2 may include a plurality of electrode patterns. For example, the first and second conductive layers CL1 and CL2 may include a plurality of sensing electrodes. The sensing electrodes included in the first and second conductive layers CL1 and CL2 will be described later in more detail.

Each of the first and second insulating layers IL1 and IL2 may include an inorganic material or an organic material. The inorganic material may include at least one of aluminum oxide, titanium oxide, silicon oxide, silicon oxynitride, zirconium oxide, and hafnium oxide. The organic material may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Each of the first and second insulating layers IL1 and IL2 may have a single-layered or multi-layered structure. Each of the first and second insulating layers IL1 and IL2 may include at least one of an inorganic layer and an organic layer. The inorganic layer and the organic layer may be formed by a chemical vapor deposition (CVD) method.

Figure 3:
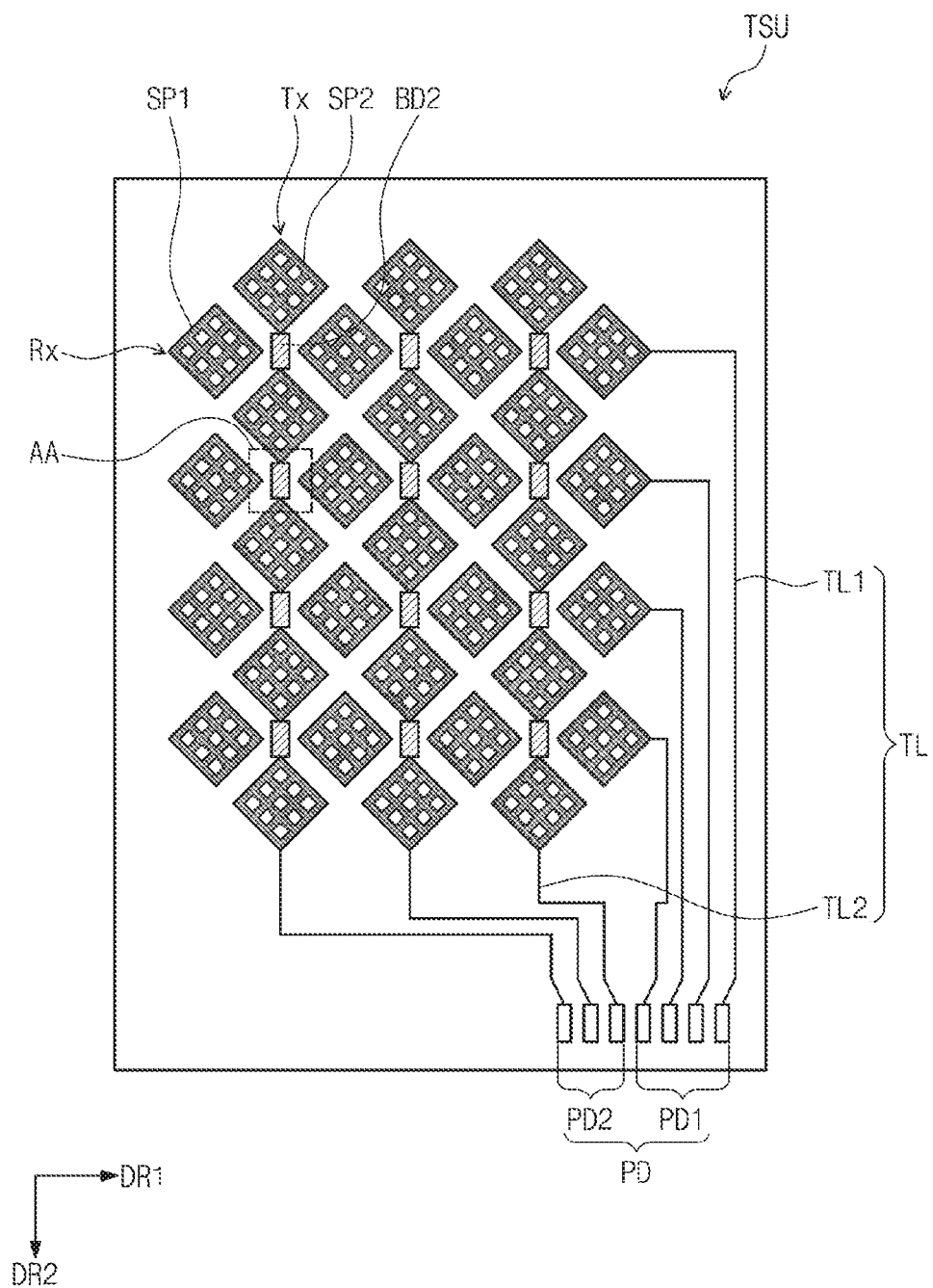
FIG. 3 is a plan view illustrating a sensor unit included in a display apparatus according to some exemplary embodiments.
Figure 4:
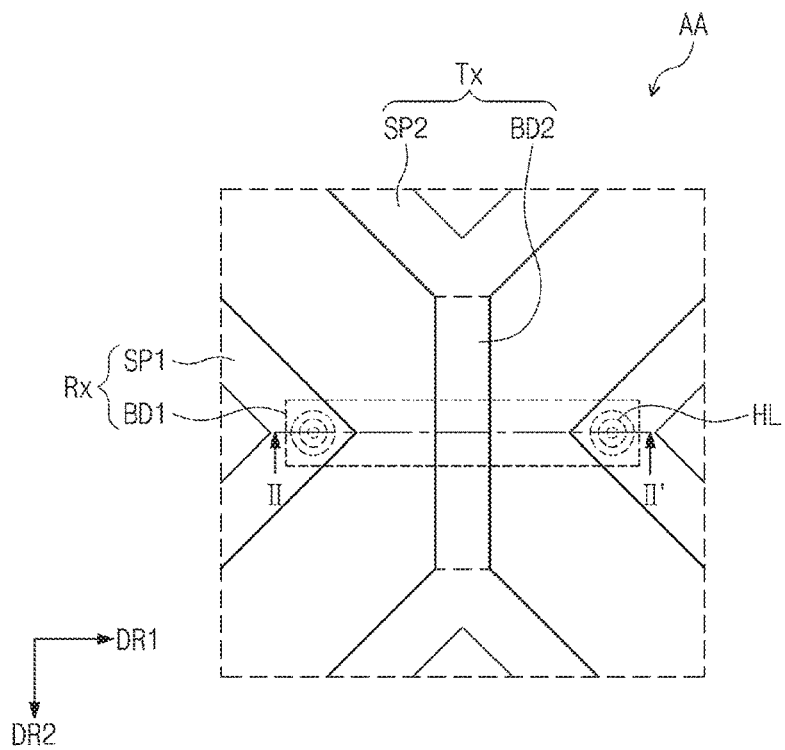
FIG. 4 is an enlarged plan view of area AA of FIG. 3 according to some exemplary embodiments.
Figure 5:
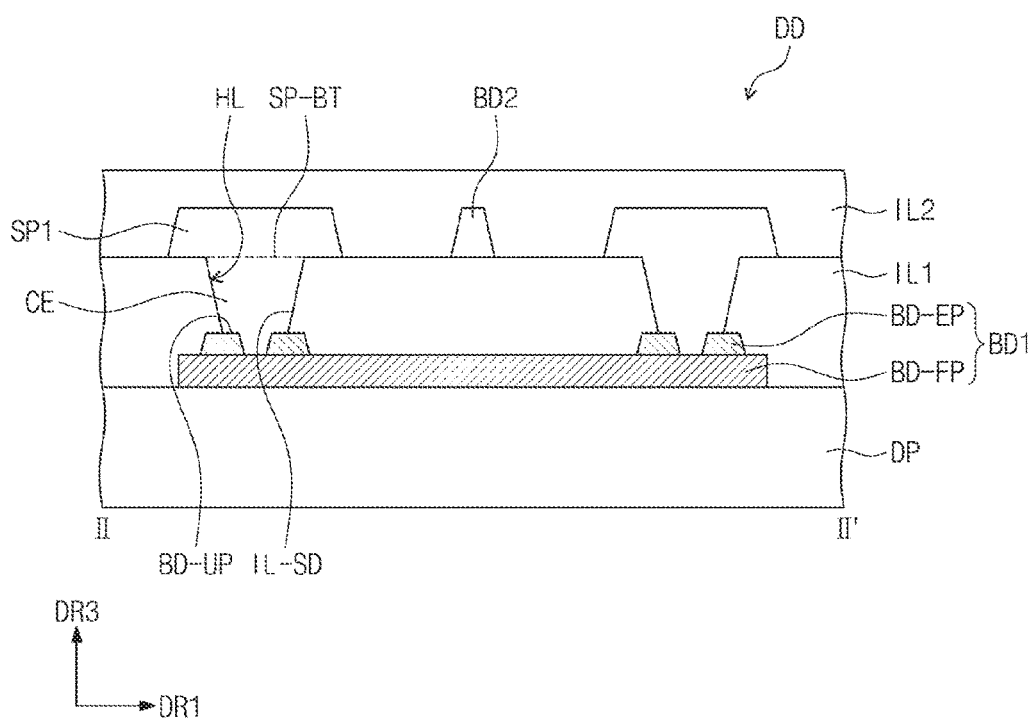
FIG. 5 is a cross-sectional view taken along sectional line II-II' of FIG. 4 according to some exemplary embodiments.

FIG. 3 is a plan view illustrating a sensor unit TSU included in a display apparatus according to some exemplary embodiments. FIG. 4 is an enlarged plan view of an area AA of FIG. 3 according to some exemplary embodiments. FIG. 5 is a cross-sectional view taken along sectional line II-II' of FIG. 4 according to some exemplary embodiments.

Referring to FIGS. 3 to 5, the sensor unit TSU may include a plurality of first sensing electrodes Rx and a plurality of second sensing electrodes Tx. In FIG. 3, the sensor unit TSU includes four first sensing electrodes Rx and three second sensing electrodes Tx. However, exemplary embodiments are not limited thereto or thereby.

For example, the first sensing electrodes Rx of the sensor unit TSU may output sensing signals, and the second sensing electrodes Tx of the sensor unit TSU may receive driving signals. However, this case is described as merely an example. In some exemplary embodiments, the first sensing electrodes Rx may receive the driving signals, and the second sensing electrodes Tx may output the sensing signals. In some exemplary embodiments, the first and second sensing electrodes Rx and Tx may receive and/or output other electrical signals.

The first sensing electrodes Rx extend in a first direction DR1 and are arranged (e.g., spaced apart from one another) in a second direction DR2. The first direction DR1 and the second direction DR2 intersect each other. Each of the first sensing electrodes Rx includes a plurality of first sensor portions SP1 and a plurality of first bridges BD1. The first sensor portions SP1 are spaced apart from each other and are arranged in the first direction DR1. Each of the first bridges BD1 connects neighboring (or adjacent) first sensor portions SP1 included in each of the first sensing electrodes Rx.

The second sensing electrodes Tx extend in the second direction DR2 and are arranged in the first direction DR1. Each of the second sensing electrodes Tx includes a plurality of second sensor portions SP2 and a plurality of second bridges BD2. The second sensor portions SP2 are spaced apart from each other and are arranged in the second direction DR2. Each of the second bridges BD2 connects neighboring second sensor portions SP2 included in each of the second sensing electrodes Tx.

In addition, in the plan view of FIG. 3, the sensor unit TSU may include interconnection lines TL that are connected to the first sensing electrodes Rx and the second sensing electrodes Tx. Furthermore, the sensor unit TSU may include touch pads PD. The interconnection lines TL may connect the first and second sensing electrodes Rx and Tx to the touch pads PD.

The interconnection lines TL may include a first interconnection line TL1 and a second interconnection line TL2. The first interconnection line TL1 may be connected to the first sensing electrode Rx, and the second interconnection line TL2 may be connected to the second sensing electrode Tx. In addition, the interconnection lines TL are electrically connected to the touch pads PD. The touch pads PD may include a first touch pad PD1 and a second touch pad PD2. The first interconnection line TL1 connects the first sensing electrode Rx to the first touch pad PD1, and the second interconnection line TL2 connects the second sensing electrode Tx to the second touch pad PD2.

The first sensing electrodes Rx and the second sensing electrodes Tx are electrically insulated from each other. For instance, the first sensor portions SP1 of the first sensing electrodes Rx and the second sensor portions SP2 of the second sensing electrodes Tx are electrically insulated from each other. Each of the first and second sensor portions SP1 and SP2 may have one of various shapes, such as a substantially diamond shape, a substantially square shape, a substantially rectangular shape, a substantially circular shape, and an irregular shape (e.g., a shape in which branches are intertwined, such as a dendrite structure). Each of the first and second sensor portions SP1 and SP2 may have a mesh shape in which a plurality of openings is defined.

The first sensing electrodes Rx and the second sensing electrodes Tx may be provided on the same layer. For example, the first sensing electrodes Rx and the second sensing electrodes Tx may be included in (or as part of) the second conductive layer CL2 of FIG. 2. Although not shown, the first sensing electrode Rx and the second sensing electrode Tx may be provided in different layers from each other. An insulating layer or an insulating pattern may be provided between the first sensing electrodes Rx and the second sensing electrodes Tx provided in the different layers from each other.

The first sensing electrodes Rx and the second sensing electrodes Tx may be provided on the display panel DP. For example, the sensor unit TSU including the first sensing electrodes Rx and the second sensing electrodes Tx may be disposed directly on the sealing layer TFE (see FIG. 2) of the display panel DP. However, exemplary embodiments are not limited thereto or thereby. The sensor unit TSU may be coupled to the display panel DP using an additional adhesive member (not shown). In this case, the sensor unit TSU may include the first and second sensing electrodes Rx and Tx, and additionally include a substrate (not shown) on which the first and second sensing electrodes Rx and Tx are provided.

The display apparatus DD, according to some exemplary embodiments, includes the display panel DP and the sensor unit TSU disposed on the display panel DP. The sensor unit TSU may include the first conductive layer CL1 (see FIG. 2) including the first bridge BD1, the second conductive layer CL2 (see FIG. 2) including the first sensor portions SP1, and the first insulating layer IL1 disposed between the first conductive layer CL1 (see FIG. 2) and the second conductive layer CL2 (see FIG. 2). In addition, the sensor unit TSU may also include contact electrodes CE that electrically connect the first sensor portions SP1 to the first bridge BD1.

In some exemplary embodiments, the first sensor portions SP1, the second sensor portions SP2, and the second bridge BD2 may be provided on the same layer. In addition, a layer in or on which the first bridge BD1 is provided may be different from a layer in or on which the first sensor portions SP1 are provided. For example, the layer in or on which the first bridge BD1 is provided may be different from the layer in or on which the first sensor portions SP1, the second sensor portions SP2, and the second bridge BD2 are provided. For instance, the first bridge BD1 may be included in the first conductive layer CL1 (see FIG. 2) of the sensor unit TSU, and the first sensor portions SP1, the second sensor portions SP2, and the second bridge BD2 may be included in the second conductive layer CL2 (see FIG. 2) of the sensor unit TSU.

The first insulating layer IL1 may be provided between the first bridge BD1 and the second bridge BD2. In addition, the second insulating layer IL2 may be provided on the first sensor portions SP1, the second sensor portions SP2, and the second bridge BD2.

The first insulating layer IL1 may be disposed on the first bridge BD1. The first insulating layer IL1 may surround the first bridge BD1 on the display panel DP. The first insulating layer IL1 may include through-holes HL. The through-holes HL may be defined between the first bridge BD1 and the first sensor portions SP1 overlapping with the first bridge BD1. The through-holes HL may be defined on the first bridge BD1 by the first insulating layer IL1.

The contact electrodes CE may be disposed between the first bridge BD1 and the first sensor portions SP1 facing the first bridge BD1. The contact electrodes CE may electrically connect the first sensor portions SP1 to the first bridge BD1. Each of the contact electrodes CE may fill a space that is defined by a bridge top surface BD-UP of the first bridge BD1 exposed by each of the through-holes HL, an insulating sidewall IL-SD of the first insulating layer IL1 defining each of the through-holes HL, and a sensor bottom surface SP-BT of each of the first sensor portions SP1 facing the first bridge BD1.

Each of the contact electrodes CE may have a cross-section having a polygonal shape when viewed in a cross-sectional view perpendicular to a top surface of the display panel DP, such as the eight sided polygonal shape illustrated in FIG. 5. It is noted, however, that each of the contact electrodes CE may have a polygonal shape having five or more sides. In other words, each of the contact electrodes CE may have a cross-section that has the polygonal shape of five or more sides and is parallel to a plane defined by an axis of the first direction DR1 and an axis of the third direction DR3. Again, as illustrated in FIG. 5, the cross-sectional shape of the contact electrode CE may have an octagonal shape of eight sides. However, exemplary embodiments are not limited thereto or thereby.

The contact electrodes CE may connect the first bridge BD1, provided for electrically connecting neighboring first sensor portions SP1 arranged in the first direction DR1, to the first sensor portions SP1 (e.g., the neighboring first sensor portions SP1 illustrated in FIGS. 4 and 5). Here, the first bridge BD1 and the first sensor portions SP1 may be disposed in different layers from each other, and the first bridge BD1 may be spaced apart from the first sensor portions SP1 by the first insulating layer IL1.

The first sensor portions SP1 and the contact electrodes CE may be formed of the same material. For example, the first sensor portions SP1 and the contact electrodes CE may be formed by the same process. However, exemplary embodiments are not limited thereto or thereby. In some exemplary embodiments, a process of forming the first sensor portions SP1 may be different from a process of forming the contact electrodes CE, and/or the first sensor portions SP1 and the contact electrodes CE may be formed of different materials.

Referring to FIG. 5, in some exemplary embodiments, the first bridge BD1 may include a bridge flat portion BD-FP and a bridge protrusion BD-EP disposed on the bridge flat portion BD-FP. The bridge flat portion BD-FP may extend in the first direction DR1, have a width in the second direction DR2, and a thickness in the third direction DR3. The bridge protrusion BD-EP may be disposed on an end portion of the bridge flat portion BD-FP. In some exemplary embodiments, the first bridge BD1 may include a plurality of bridge protrusions BD-EP. When the first bridge BD1 includes the plurality of bridge protrusions BD-EP, at least one of the bridge protrusions BD-EP may be disposed on an end portion of the bridge flat portion BD-FP, and the other(s) of the bridge protrusions BD-EP may be disposed on another end portion of the bridge flat portion BD-FP.

Figure 6A:
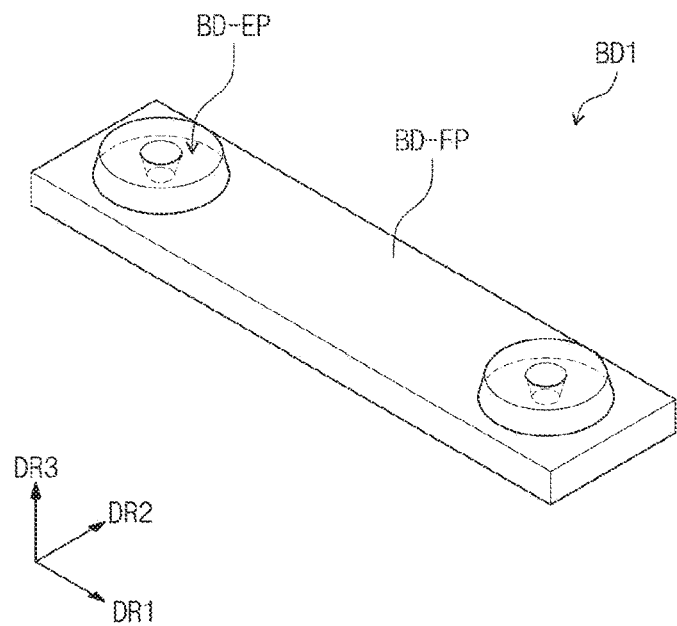
FIGS. 6A and 6B are perspective views illustrating a first bridge included in a display apparatus according to various exemplary embodiments.
Figure 6B:
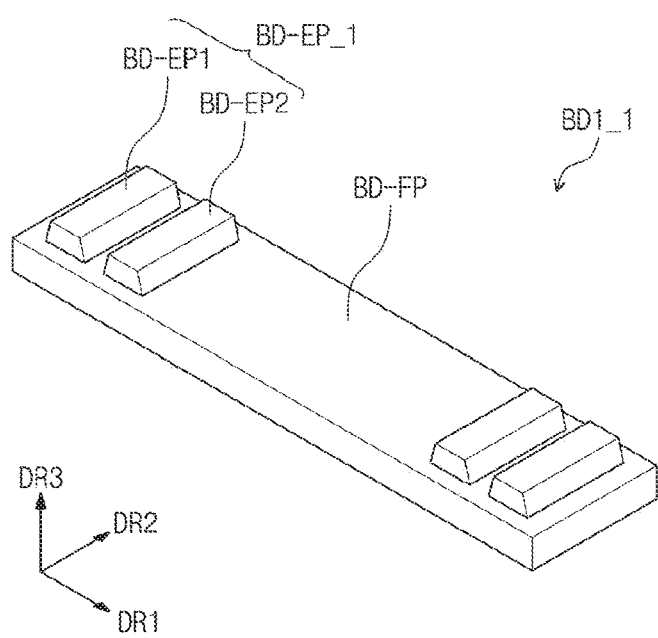

FIGS. 6A and 6B are perspective views illustrating some embodiments of the first bridge BD1 illustrated in FIG. 5. Referring to FIGS. 6A and 6B, the first bridge BD1 may include the bridge flat portion BD-FP having an extending length in the first direction DR1 longer than an extending length in the second direction DR2, and the bridge protrusions BD-EP respectively disposed on one end portion and another end portion of the bridge flat portion BD-FP.

FIGS. 6A and 6B are perspective views illustrating first bridges BD1 and BD1_1 of different shapes included in a display apparatus according to various exemplary embodiments. For instance, the bridge protrusion BD-EP of the first bridge BD1 illustrated in FIG. 6A may have a hollow truncated cone shape. The bridge protrusion BD-EP_1 of the first bridge BD1_1 illustrated in FIG. 6B may include sub-protrusions BD-EP1 and BD-EP2 having truncated quadrangular pyramid shapes. However, exemplary embodiments are not limited to or by the shapes of the bridge protrusions BD-EP and BD-EP_1 illustrated in FIGS. 6A and 6B.

Referring again to FIG. 5, the bridge protrusion BD-EP may overlap with the first sensor portion SP1 connected to the contact electrode CE. In addition, a portion of a sidewall of the bridge protrusion BD-EP and a portion of a top surface of the bridge protrusion BD-EP may be disposed in the through-hole HL. For example, the contact electrode CE may fill a space that is defined by the bridge-top surface BD-UP and the sidewall of the bridge protrusion BD-EP disposed in the through-hole HL, an exposed top surface of the bridge flat portion BD-FP disposed in the through-hole HL, the insulating sidewall IL-SD of the first insulating layer IL1 defining the through-hole HL, and the sensor bottom surface SP-BT of the first sensor portion SP1 overlapping with the through-hole HL. In some exemplary embodiments, since the contact electrode CE of the sensor unit TSU includes the cross-section having the polygonal shape of five or more sides, a contact area between the contact electrode CE and the first bridge BD1 may be increased. As a result, it is possible to reduce a contact resistance between the contact electrode CE and the first bridge BD1.

Figure 7A:
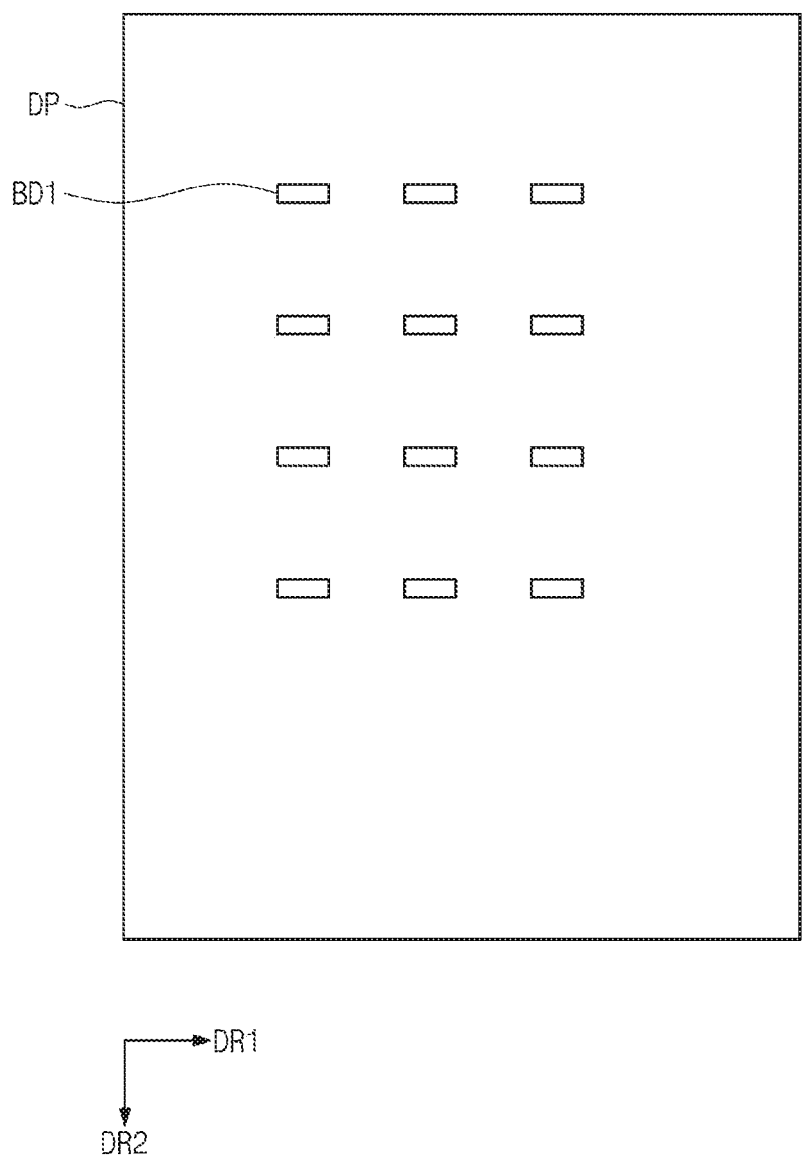
FIGS. 7A and 7B are plan views illustrating a sensor unit included in a display apparatus according to some exemplary embodiments.
Figure 7B:
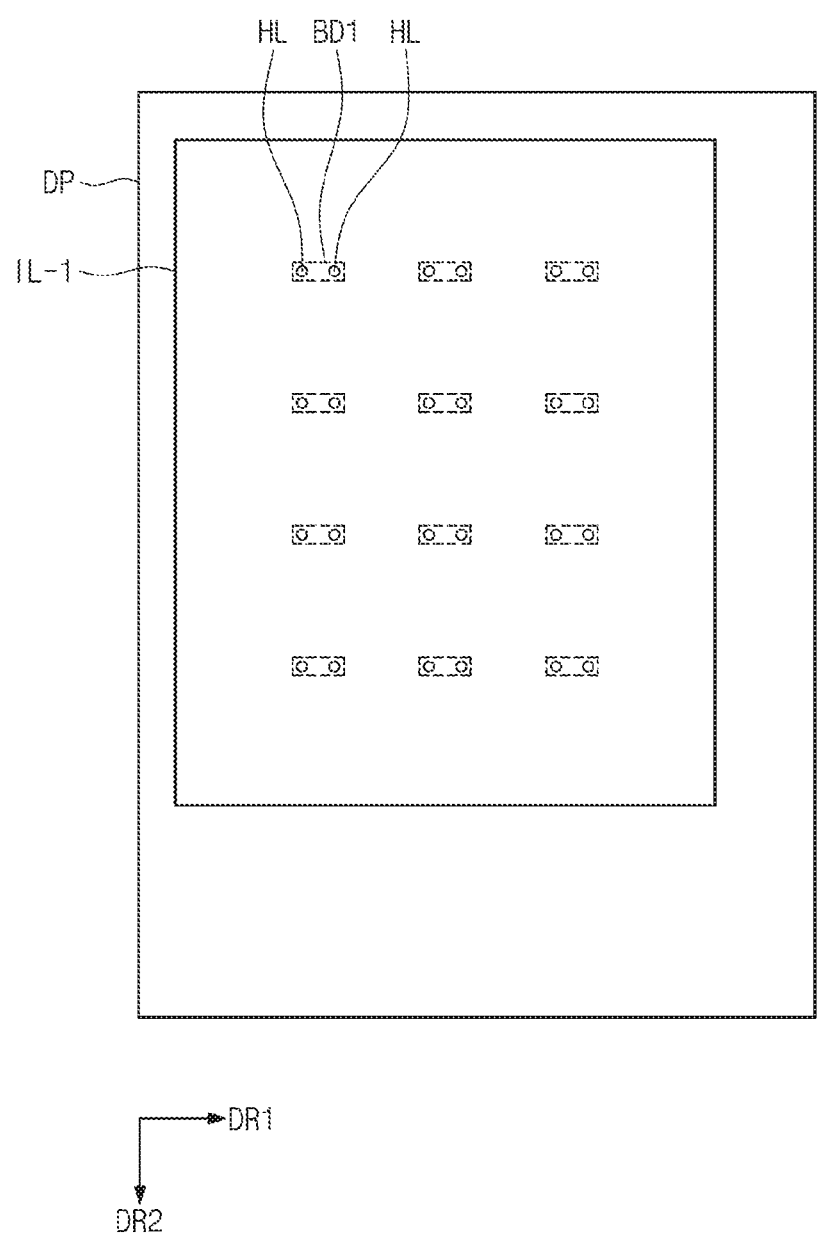

FIGS. 7A and 7B are plan views illustrating a sensor unit TSU included in a display apparatus according to some exemplary embodiments. That is, FIG. 7A is a plan view illustrating the first conductive layer CL1 (see FIG. 2) of the sensor unit TSU, and FIG. 7B is a plan view illustrating the first insulating layer IL1 of the sensor unit TSU according to various exemplary embodiments.

Referring to FIG. 7A, the first conductive layer CL1 (see FIG. 2) may include a plurality of the first bridges BD1. The first bridges BD1 may be disposed on the display panel DP, e.g., directly on the sealing layer TFE (see FIG. 2) of the display panel DP. Each of the first bridges BD1 may extend in the first direction DR1 to connect neighboring ones of the first sensor portions SP1 included in the sensor unit TSU illustrated in FIG. 3. For example, the first bridges BD1 may intersect and overlap with the second bridges BD2 of the sensor unit TSU illustrated in FIG. 3.

As illustrated in FIG. 7B, the sensor unit TSU may include the first insulating layer IL1 covering the first bridges BD1. The through-holes HL partially exposing the first bridges BD1 may be defined in the first insulating layer IL1. The through-holes HL may be formed using a photolithography process.

Figure 8A:
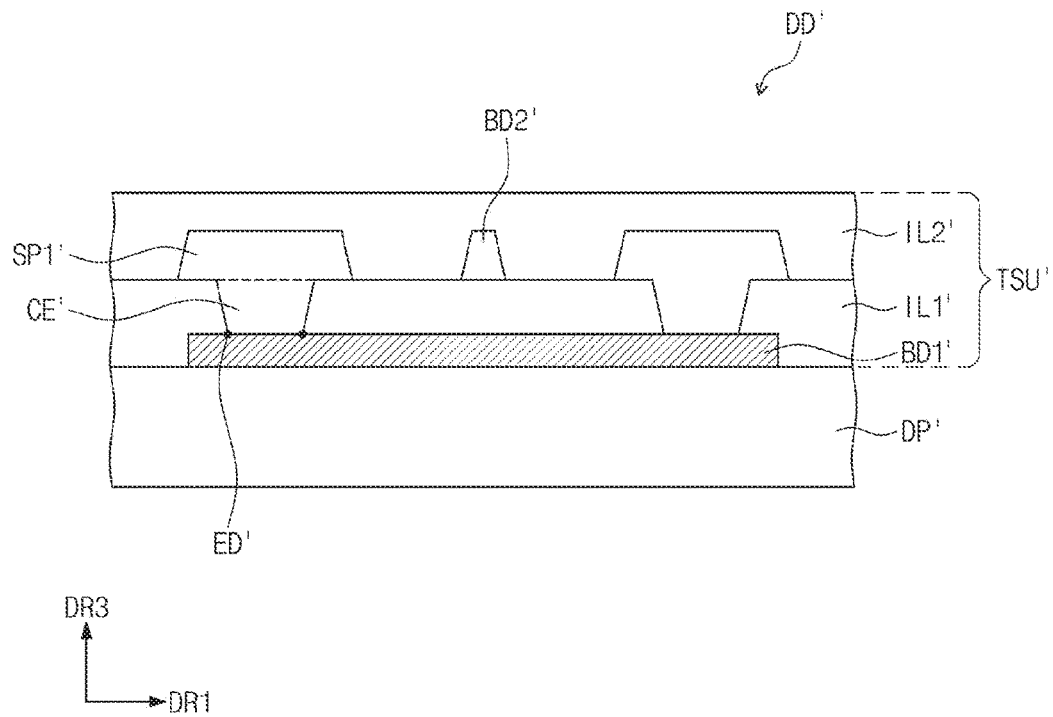
FIG. 8A is a cross-sectional view illustrating a conventional display apparatus.
Figure 8B:
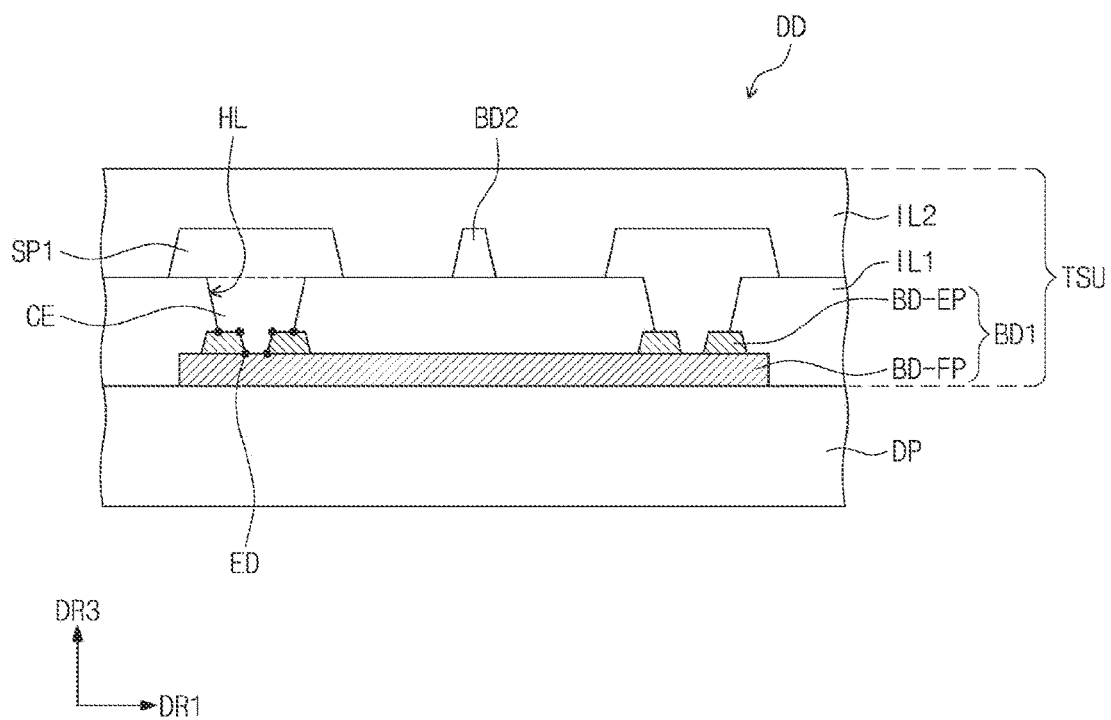
FIG. 8B is a cross-sectional view illustrating a display apparatus according to some exemplary embodiments.

In the sensor unit TSU included in the display apparatus DD according to some exemplary embodiments, the contact electrode CE having the polygonal-shaped cross-section may have a plurality of edge portions in a portion in contact with the first bridge BD1. FIG. 8A is a cross-sectional view illustrating a conventional display apparatus DD'. FIG. 8B is a cross-sectional view illustrating the display apparatus DD according to some exemplary embodiments.

FIG. 8B is a cross-sectional view taken along sectional line II-II' of FIG. 4 according to some exemplary embodiments. FIG. 8A is a cross-sectional view of a conventional display apparatus at the same position as FIG. 8B. In FIGS. 8A and 8B, portions corresponding to edge portions are represented as dots for illustrative and descriptive convenience; however, real edge portions do not have dot shapes.

Referring to FIG. 8A, in the conventional display apparatus DD', a first bridge BD1' may not include an uneven portion, such as a protrusion or a concave portion. In the conventional display apparatus DD', a cross-section of a contact electrode CE' connecting a first sensor portion SP1' to the first bridge BD1' has a quadrangular shape in a plane defined by an axis of the first direction DR1 and an axis of the third direction DR3. In other words, the cross-section of the contact electrode CE', which is perpendicular to a top surface of a display panel DP', may have the quadrangular shape, e.g., a trapezoid shape. In a cross-section of the conventional display apparatus DD' illustrated in FIG. 8A, one contact electrode CE' may have two edge portions ED' in a portion being in contact with the first bridge BD1'.

Referring to FIG. 8B, in the display apparatus DD according to some exemplary embodiments, the cross-section of the contact electrode CE has the polygonal shape of five or more sides. The cross section of the contact electrode CE may have the octagonal shape in the exemplary embodiment of FIG. 8B. For example, in the cross-section of the contact electrode CE, a length of a side in contact with the first sensor portion SP1 may be greater than a length of a side in contact with the bridge flat portion BD-FP. As seen in FIG. 8B, one contact electrode CE may have six edge portions ED in the portion in contact with the first bridge BD1. In FIGS. 8A and 8B, the edge portions ED' and ED may correspond to vertexes of the contact electrodes CE' and CE in the contact portions of the contact electrodes CE' and CE and the first bridges BD1' and BD1 in the cross-sections of the contact electrodes CE' and CE perpendicular to the top surfaces of the display panels DP' and DP.

In other words, the number of the edge portions ED in contact with the first bridge BD1 of the contact electrode CE of the display apparatus DD is increased as compared with the number of edge portions ED' of the conventional display apparatus DD'. Thus, it is possible to reduce the contact resistance between the contact electrode CE and the first bridge BD1. This is because the edge portions ED generate a strong electric field between the contact electrode CE and the first bridge BD1 such that a current can more smoothly flow between the contact electrode CE and the first bridge BD1. In other words, the contact resistance of sensing electrodes of the sensor unit TSU in the display apparatus DD including a larger number of the edge portions ED can be reduced as compared with that of a conventional display apparatus.

Figure 9:
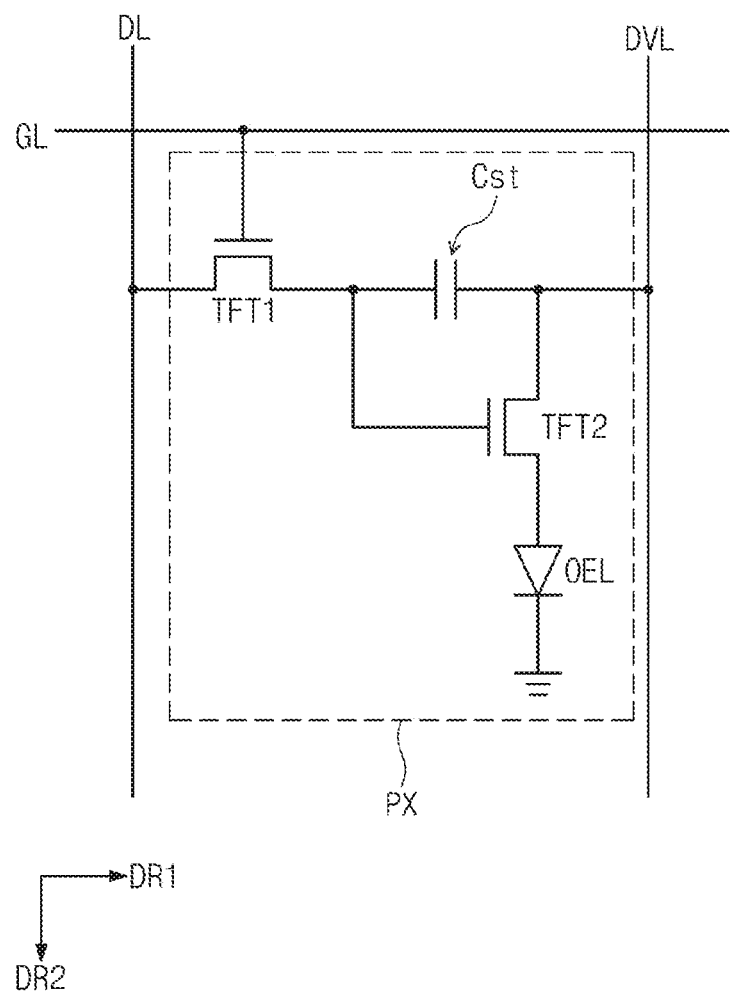
FIG. 9 is a circuit diagram illustrating a pixel of a display panel included in a display apparatus according to some exemplary embodiments.
Figure 10:
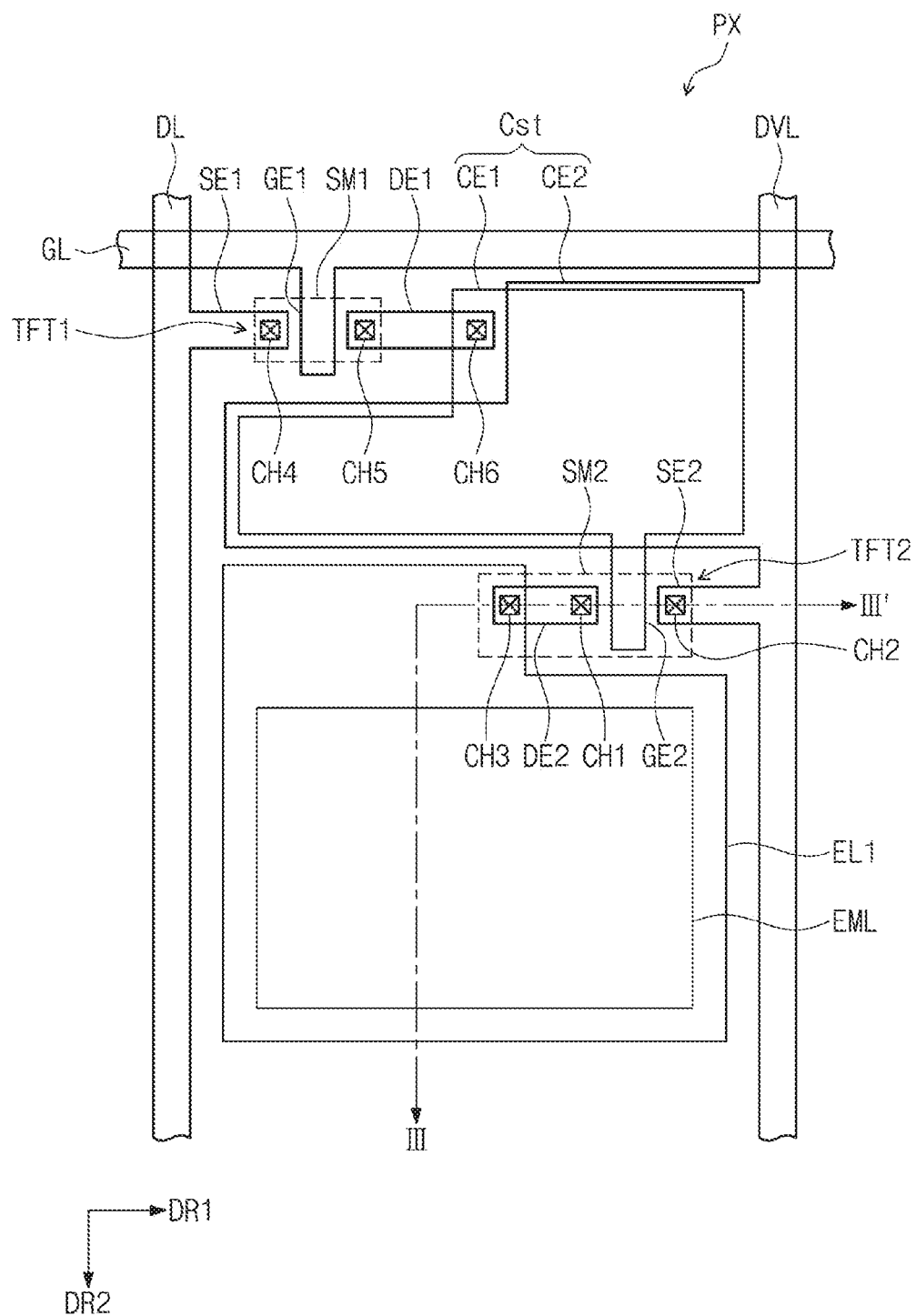
FIG. 10 is a plan view illustrating a pixel of a display panel included in a display apparatus according to some exemplary embodiments.
Figure 11:
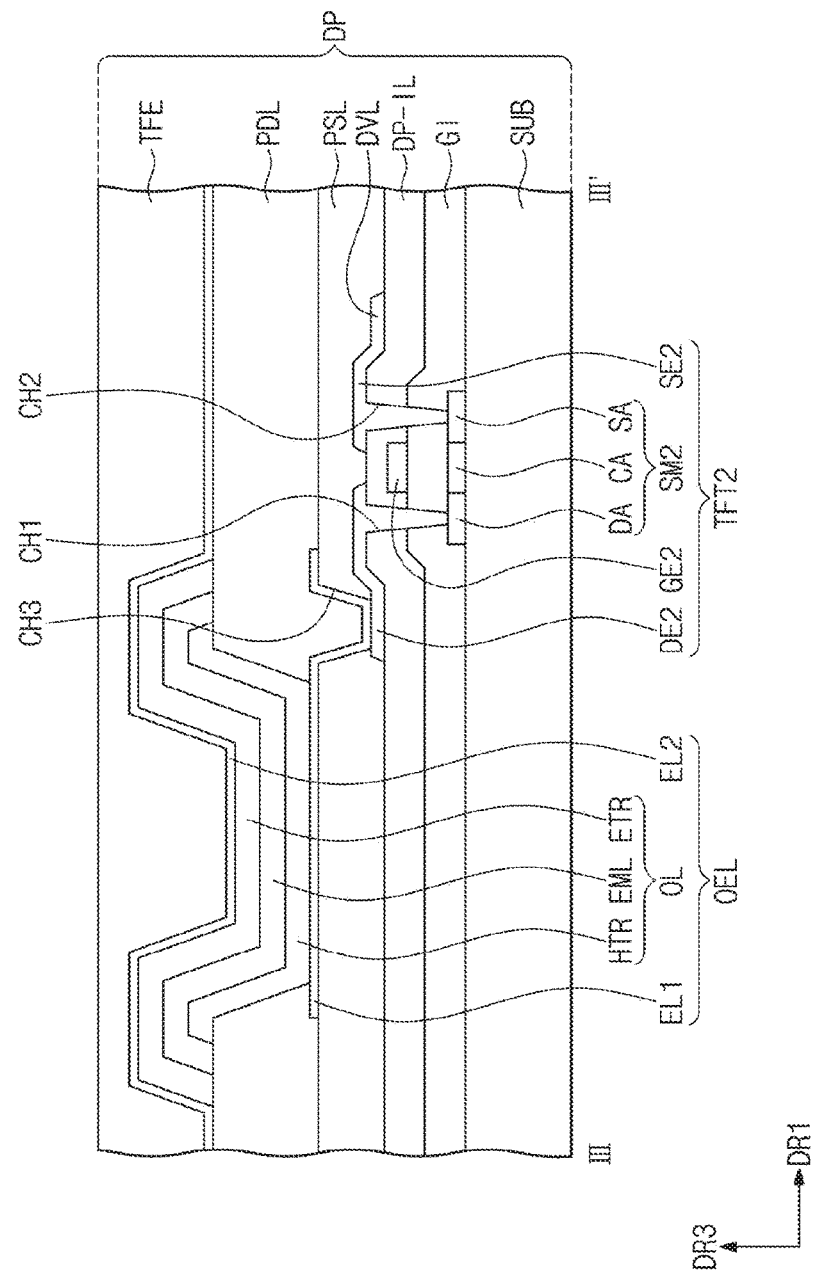
FIG. 11 is a cross-sectional view taken along sectional line III-III' of FIG. 10 according to some exemplary embodiments.

FIGS. 9 to 11 illustrate a representative pixel PX included in the display panel DP according to various exemplary embodiments. That is, FIG. 9 is a circuit diagram illustrating a pixel PX of a display panel DP included in a display apparatus DD according to some exemplary embodiments. FIG. 10 is a plan view illustrating a pixel PX of a display panel DP included in a display apparatus DD according to some exemplary embodiments. FIG. 11 is a cross-sectional view taken along sectional line III-III' of FIG. 10 according to some exemplary embodiments.

Referring to FIGS. 9 and 10, each of pixels PX may be connected to an interconnection portion including gate lines GL, data lines DL, and driving voltage lines DVL. Each of the pixels PX includes thin film transistors TFT1 and TFT2 connected to the interconnection portion, and an organic electroluminescent device OEL and a capacitor Cst connected to the thin film transistors TFT1 and TFT2.

As seen in FIG. 10, one pixel PX is connected to one gate line GL, one data line DL, and one driving voltage line DVL as an example. However, exemplary embodiments are not limited thereto or thereby. In some exemplary embodiments, a plurality of pixels PX may be connected to one gate line, one data line, and one driving voltage line. In still other exemplary embodiments, one or more pixels may be connected to at least one gate line, at least one data line, and at least one driving voltage line.

The gate lines GL may extend in the first direction DR1. The data lines DL may extend in the second direction DR2 intersecting, but insulated from the gate lines GL. The driving voltage lines DVL may extend in substantially the same direction (e.g., the second direction DR2) as the data lines DL. The gate line GL transmits a scan signal to at least one of the thin film transistors TFT1 and TFT2, and the data line DL transmits a data signal to at least one of the thin film transistors TFT1 and TFT2. The driving voltage line DVL provides a driving voltage to at least one of the thin film transistors TFT1 and TFT2.

Each of the pixels PX may emit light having a specific color, e.g., red light, green light, or blue light. The kind of the color of light is not limited thereto or thereby. In some exemplary embodiments, white light, cyan light, magenta light, and/or yellow light may be added. It is contemplated, however, that any suitable color of light may be utilized.

The thin film transistors TFT1 and TFT2 may include a driving thin film transistor TFT2 for controlling the organic electroluminescent device OEL, and a switching thin film transistor TFT1 for switching the driving thin film transistor TFT2. Although each of the pixels PX is shown as including two thin film transistors TFT1 and TFT2, exemplary embodiments are not limited thereto or thereby. In some exemplary embodiments, each of the pixels PX may include a single thin film transistor and a single capacitor or may include three or more thin film transistors and two or more capacitors.

The switching thin film transistor TFT1 includes a first gate (or control) electrode GE1, a first source (or input) electrode SE1, and a first drain (or output) electrode DE1. The first gate electrode GE1 is connected to the gate line GL, and the first source electrode SE1 is connected to the data line DL. The first drain electrode DE1 is connected to a first common electrode CE1 through a sixth contact hole CH6. The switching thin film transistor TFT1 transmits the data signal provided from the data line DL to the driving thin film transistor TFT2 in response to the scan signal applied to the gate line GL.

The driving thin film transistor TFT2 includes a second gate electrode GE2, a second source electrode SE2, and a second drain electrode DE2. The second gate electrode GE2 is connected to the first common electrode CE1. The second source electrode SE is connected to the driving voltage line DVL. The second drain electrode DE2 is connected to a first electrode EL1 through a third contact hole CH3.

In other words, the first electrode EL1 is electrically connected to the second drain electrode DE2 of the driving thin film transistor TFT2. A common voltage is applied to a second electrode EL2 (see FIG. 11), and a light-emitting layer EML emits light on the basis of an output signal of the driving thin film transistor TFT2, thereby displaying an image. The first electrode EL1 and the second electrode EL2 will be described later in more detail.

The capacitor Cst is connected between the second gate electrode GE2 and the second source electrode SE2 of the driving thin film transistor TFT2. The capacitor Cst stores and maintains the data signal input to the second gate electrode GE2 of the driving thin film transistor TFT2. The capacitor Cst may include the first common electrode CE1 connected to the first drain electrode DE1 through the sixth contact hole CH6, and a second common electrode CE2 connected to the driving voltage line DVL.

Referring to FIGS. 9 to 11, the display panel DP included in the display apparatus DD according to some exemplary embodiments may include the base substrate SUB, the thin film transistors TFT1 and TFT2 provided on the base substrate SUB, and the organic electroluminescent device OEL connected to the thin film transistors TFT1 and TFT2.

The base substrate SUB may be a plastic substrate, a glass substrate, a metal substrate, or an organic/inorganic composite substrate. The plastic substrate may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin. The base substrate SUB may be a flexible substrate. Alternatively, the base substrate SUB may be a rigid substrate or a substrate including at least one ridged portion and at least one flexible portion. However, exemplary embodiments are not limited thereto or thereby. In some exemplary embodiments, the base substrate SUB may be selected in consideration of various factors, such as mechanical strength, thermal stability, transparency, surface flatness, ease of handling, and waterproofing. The base substrate SUB may be transparent.

A substrate buffer layer (not shown) may be provided on the base substrate SUB. The substrate buffer layer (not shown) may prevent (or reduce) impurities from being diffused into the switching thin film transistor TFT1 and the driving thin film transistor TFT2. The substrate buffer layer (not shown) may be formed of silicon nitride ($SiN_x$), silicon oxide ($SiO_x$), and/or silicon oxynitride ($SiO_xN_y$). The substrate buffer layer (not shown) may be omitted according to a material of the base substrate SUB and a process condition.

A first semiconductor pattern SM1 and a second semiconductor pattern SM2 are provided on the base substrate SUB. The first semiconductor pattern SM1 and the second semiconductor pattern SM2 are formed of a semiconductor material and act as active layers of the switching thin film transistor TFT1 and the driving thin film transistor TFT2, respectively. Each of the first and second semiconductor patterns SM1 and SM2 includes a source portion SA, a drain portion DA, and a channel portion CA provided between the source portion SA and the drain portion DA. Each of the first and second semiconductor patterns SM1 and SM2 may be formed of an inorganic semiconductor or an organic semiconductor. The source portion SA and the drain portion DA may be doped with N-type dopants or P-type dopants.

A gate insulating layer GI is provided on the first semiconductor pattern SM1 and the second semiconductor pattern SM2. The gate insulating layer GI covers the first semiconductor pattern SM1 and the second semiconductor pattern SM2. The gate insulating layer GI may be formed of an inorganic insulating material.

The first gate electrode GE1 and the second gate electrode GE2 are provided on the gate insulating layer GI. The first gate electrode GE1 and the second gate electrode GE2 cover an area corresponding to the channel portion CA of the first semiconductor pattern SM1 and an area corresponding to the channel portion CA of the second semiconductor pattern SM2, respectively.

A substrate insulating layer DP-IL is provided on the first gate electrode GE1 and the second gate electrode GE2. The substrate insulating layer DP-IL covers the first gate electrode GE1 and the second gate electrode GE2. The substrate insulating layer DP-IL may be formed of an inorganic insulating material or an organic insulating material.

The first source electrode SE1, the first drain electrode DE1, the second source electrode SE2, and the second drain electrode DE2 are provided on the substrate insulating layer DP-IL. The second drain electrode DE2 is in contact with the drain portion DA of the second semiconductor pattern SM2 through a first contact hole CH1 formed in the gate insulating layer GI and the substrate insulating layer DP-IL, and the second source electrode SE2 is in contact with the source portion SA of the second semiconductor pattern SM2 through a second contact hole CH2 formed in the gate insulating layer GI and the substrate insulating layer DP-IL. The first source electrode SE1 is in contact with the source portion of the first semiconductor pattern SM1 through a fourth contact hole CH4 formed in the gate insulating layer GI and the substrate insulating layer DP-IL, and the first drain electrode DE1 is in contact with the drain portion of the first semiconductor pattern SM1 through a fifth contact hole CH5 formed in the gate insulating layer GI and the substrate insulating layer DP-IL.

A passivation layer PSL is provided on the first source electrode SE1, the first drain electrode DE1, the second source electrode SE2, and the second drain electrode DE2. The passivation layer PSL may act as a protective layer protecting the switching thin film transistor TFT1 and the driving thin film transistor TFT2 and/or may act as a planarization layer having a planarized top surface.

The first electrode EL1 is provided on the passivation layer PSL. The first electrode EL1 is connected to the second drain electrode DE2 of the driving thin film transistor TFT2 through the third contact hole CH3 formed in the passivation layer PSL.

A pixel defining layer PDL partitioning the light-emitting layer EML corresponding to each of the pixels PX is provided on the passivation layer PSL. The pixel defining layer PDL may expose a top surface of the first electrode EL1 and may protrude from the base substrate SUB. The pixel defining layer PDL may include, but is not limited to, a metal-fluorine ion compound. For example, the pixel defining layer PDL may include a metal-fluorine ion compound selected from a group consisting of LiF, $BaF_2$, and CsF. The metal-fluorine ion compound may have insulating characteristics when it has a determined thickness. For example, a thickness of the pixel defining layer PDL may range from 10 nm to 100 nm.

The organic electroluminescent device OEL is provided in a region surrounded by the pixel defining layer PDL. The organic electroluminescent device OEL includes the first electrode EL1, an organic layer OL, and the second electrode EL2. The organic layer OL may include a hole transport region HTR, the light-emitting layer EML, and an electron transport region ETR.

The first electrode EL1 has conductivity. The first electrode EL1 may be a pixel electrode or an anode. The first electrode EL1 may be a transparent electrode, a semitransparent electrode, or a reflective electrode. Although not illustrated, it is also contemplated that the first electrode EL1 may be a multi-layered structure including a transparent or semitransparent electrode layer and a reflective electrode layer. When the first electrode EL1 is the transparent electrode, the first electrode EL1 may be formed of a transparent metal oxide, such as indium tin oxide (ITO), indium zinc oxide (IZO), zinc oxide (ZnO), or indium tin zinc oxide (ITZO). When the first electrode EL1 is the semitransparent electrode or the reflective electrode, the first electrode EL1 may include at least one of Al, Cu, Ti, Mo, Ag, Mg, Pt, Pd, Au, Ni, Nd, Ir, and Cr.

The organic layer OL is provided on the first electrode EL1. The organic layer OL includes the light-emitting layer EML. The organic layer OL may further include the hole transport region HTR and the electron transport region ETR.

The hole transport region HTR is provided on the first electrode EL1. The hole transport region HTR may include at least one of a hole injection layer, a hole transport layer, a buffer layer, and an electron stop layer. The hole transport region HTR may have a single-layered structure formed of a single material, a single-layered structure formed of different materials from each other, or a multi-layered structure including a plurality of layers formed of different materials from each other.

For example, the hole transport region HTR may include a plurality of layers formed of different materials. Alternatively, the hole transport region HTR may have, but is not limited to or by, a structure of the hole injection layer/the hole transport layer sequentially stacked on the first electrode EL1, a structure of the hole injection layer/the hole transport layer/the buffer layer sequentially stacked on the first electrode EL1, a structure of the hole injection layer/the buffer layer sequentially stacked on the first electrode EL1, a structure of the hole transport layer/the buffer layer sequentially stacked on the first electrode EL1, or a structure of the hole injection layer/the hole transport layer/the electron stop layer sequentially stacked on the first electrode EL1.

When the hole transport region HTR includes the hole injection layer, the hole transport region HTR may include, but is not limited to, a phthalocyanine compound (e.g., copper phthalocyanine), N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino) triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), or (polyaniline)/poly(4-styrenesulfonate) (PANI/PSS).

When the hole transport region HTR includes the hole transport layer, the hole transport region HTR may include, but is not limited to, a carbazole-based derivative (e.g., N-phenylcarbazole or polyvinylcarbazole), a fluorene-based derivative, a triphenylamine-based derivative (e.g., N,N'-bis(3-methylphenyl)-N,N'-diphenyl-[1,1-biphenyl]-4,4'-diamine (TPD), 4,4',4"-tris(N-carbazolyl)triphenylamine (TCTA)), N,N'-di(1-naphthyl)-N,N'-diphenylbenzidine (NPB), or 4,4'-cyclohexylidene bis[N,N-bis(4-methylphenyl)benzenamine] (TAPC).

The light-emitting layer EML is provided on the hole transport region HTR. The light-emitting layer EML may have a single-layered structure formed of a single material, a single-layered structure formed of different materials from each other, or a multi-layered structure including a plurality of layers formed of different materials from each other.

The light-emitting layer EML may include a commonly used material and may not be limited to a specific material. For example, the light-emitting layer EML may be formed of a material emitting red light, green light, and/or blue light and/or may include a fluorescent material or a phosphorescent material. In addition, the light-emitting layer EML may include a host or a dopant.

The host may include a commonly used material and may not be limited to a specific material. For example, the host may include tris(8-hydroxyquinolino)aluminum (Alq3), 4,4'-bis(N-carbazolyl)-1,1'-biphenyl (CBP), poly(N-vinyl-carbazole) (PVK), 9,10-di(naphthalene-2-yl)anthracene (and), 4,4',4"-Tris(carbazol-9-yl)-triphenylamine (TCTA), 1,3,5-tri(1-phenyl-1H-benzo[d]imidazole-2-yl)benzene (TPBi), 3-tert-butyl-9,10-di(naphth-2-yl)anthracene (TBADN), distyrylarylene (DSA), 4,4'-bis(9-carbazolyl)-2,2"-dimethyl-biphenyl (CDBP), or 2-methyl-9,10-bis(naphthalen-2-yl)anthracene (MADN).

When the light-emitting layer EML emits red light, the light-emitting layer EML may include, for example, a fluorescent material including tris(dibenzoylmethanato) phenanthoroline europium (PBD:Eu(DBM)3(Phen)) or perylene. When the light-emitting layer EML emits red light, the dopant included in the light-emitting layer EML may include, for example, a metal complex or organometallic complex, such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP).

When the light-emitting layer EML emits green light, the light-emitting layer EML may include, for example, a fluorescent material including tris(8-hydroxyquinolino)aluminum (Alq3). When the light-emitting layer EML emits green light, the dopant included in the light-emitting layer EML may include, for example, a metal complex or organometallic complex, such as fac-tris(2-phenylpyridine)iridium (Ir(ppy)3).

When the light-emitting layer EML emits blue light, the light-emitting layer EML may include, for example, a fluorescent material that includes one selected from a group consisting of spiro-DPVBi, spiro-6P, distyryl-benzene (DSB), distyryl-arylene (DSA), a polyfluorene (PFO)-based polymer, and poly(p-phenylene vinylene) (PPV)-based polymer. When the light-emitting layer EML emits blue light, the dopant included in the light-emitting layer EML may include, for example, a metal complex or organometallic complex, such as (4,6-F2ppy)2Irpic. The light-emitting layer EML will be described later in more detail.

The electron transport region ETR is provided on the light-emitting layer EML. The electron transport region ETR may include at least one of a hole stop layer, an electron transport layer, and an electron injection layer. However, exemplary embodiments are not limited thereto or thereby.

When the electron transport region ETR includes the electron transport layer, the electron transport region ETR may include, but is not limited to, tris(8-hydroxyquinolinato)aluminum (Alq3), 1,3,5-Tri(1-phenyl-1H-benzo[d]imidazol-2-yl)benzene (TPBi), 2,9-dimethyl-4,7-diphenyl-1,10-phenanthroline (BCP), 4,7-Diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato) aluminum (BAlq), berylliumbis(benzoquinolin-10-olate) (Bebq2), 9,10-di(naphthalene-2-yl)anthracene (ADN), or any mixture thereof.

When the electron transport region ETR includes the electron injection layer, the electron transport region ETR may include, but is not limited to, LiF, LiQ (lithium quinolate), Li$_2$O, BaO, NaCl, CsF, a lanthanide metal (e.g., Yb), or a halogenated method (e.g., RbCl or RbI). The electron injection layer may also be formed of a material in which an electron transfer material is mixed with an insulating organic metal salt. The organic metal salt may have an energy band gap of about 4 eV or more. For example, the organic metal salt may include a metal acetate, a metal benzoate, a metal acetoacetate, a metal acetylacetonate, or a metal stearate. A thickness of the electron injection layer may range from about 1 Å to about 100 Å. For instance, the thickness of the electron injection layer may range from about 3 Å to about 90 Å. When the thickness of the electron injection layer satisfies the range, sufficient electron injection characteristics may be obtained without a substantial increase in driving voltage.

The second electrode EL2 is provided on the electron transport region ETR. The second electrode EL2 may be a common electrode or a cathode. The second electrode EL2 may be a transparent electrode, a semitransparent electrode, or a reflective electrode. When the second electrode EL2 is the transparent electrode, the second electrode EL2 may include Li, Ca, LiF/Ca, LiF/Al, Al, Mg, BaF, Ba, Ag, any compound thereof, or any mixture thereof (e.g., a mixture of Ag and Mg). When the second electrode EL2 is the semitransparent electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, any compound thereof, or a mixture thereof (e.g., a mixture of Ag and Mg). In some exemplary embodiments, the second electrode EL2 may have a multi-layered structure that includes a reflective layer or semitransparent layer formed of Ag, Mg, Cu, Al, Pt, Pd, Au, Ni, Nd, Ir, Cr, Li, Ca, LiF/Ca, LiF/Al, Mo, Ti, or a compound or mixture thereof, and a transparent conductive layer formed of indium tin oxide (ITO), indium zinc oxide (IZO), zinc oxide (ZnO), or indium tin zinc oxide (ITZO).

The second electrode EL2 may be connected to an auxiliary electrode. The auxiliary electrode may include a layer formed by depositing Ag, Mg, Cu, Al, Pt, Pd, Au, Ni, Nd, Ir, Cr, Li, Ca, LiF/Ca, LiF/Al, Mo, Ti, or a compound or mixture thereof toward the light-emitting layer EML, and another layer formed by depositing a transparent metal oxide (e.g., indium tin oxide (ITO), indium zinc oxide (IZO), zinc oxide (ZnO), or indium tin zinc oxide (ITZO)), Mo, or Ti on the layer.

When the organic electroluminescent device OEL is a front surface light-emitting type, the first electrode EL1 may be the reflective electrode and the second electrode EL2 may be the transparent electrode or the semitransparent electrode. When the organic electroluminescent device OEL is a back surface light-emitting type, the first electrode EL1 may be the transparent electrode or the semitransparent electrode and the second electrode EL2 may be the reflective electrode. It is also contemplated that the organic electroluminescent device OEL may be a both surface light-emitting type in which the first electrode EL1 and the second electrode EL2 may be the transparent electrode or the semitransparent electrode.

When voltages are applied to the first and second electrodes EL1 and EL2 of the organic electroluminescent device OEL, respectively, holes provided from the first electrode EL1 may move to the light-emitting layer EML through the hole transport region HTR, and electrons provided from the second electrode EL2 may move to the light-emitting layer EML through the electron transport region ETR. The electrons and the holes may be recombined with each other in the light-emitting layer EML to generate excitons, and the excitons may emit light through transition from an excited state to a ground state.

Meanwhile, the display panel DP of the display apparatus DD illustrated in FIG. 2 may include the circuit layer PCL, and the circuit layer PCL may include the gate line GL, the data line DL, the driving voltage line DVL, the switching thin film transistor TFT1, the driving thin film transistor TFT2, the capacitor Cst, the first semiconductor pattern SM1, the second semiconductor pattern SM2, the first electrode EL1, and the second electrode EL2, which are described with reference to FIGS. 9 to 11.

FIGS. 12A, 12B, 12C, 12D, and 12E are cross-sectional views illustrating contact electrodes included in display apparatuses according to various exemplary embodiments. The cross-sectional views of FIGS. 12A to 12E may be taken along sectional line II-II' of FIG. 4. In other words, FIGS. 12A to 12E are cross-sectional views, each of which illustrate two first sensor portions SP1 adjacent to each other, a corresponding first bridge electrically connecting the two first sensor portions SP1, and corresponding contact electrodes electrically connecting the first bridge to the first sensor portions SP1. In the exemplary embodiments of FIGS. 12A to 12E, the description of the same (or similar) elements as previously described in connection with FIGS. 1 to 11 will be omitted or mentioned briefly for convenience and to avoid obscuring exemplary embodiments. In other words, primarily differences will be described below, and similarly configured elements are similarly referenced in the corresponding figures.

A display apparatus of the exemplary embodiments of FIGS. 12A to 12E include a display panel DP and a sensor unit (e.g., one of sensor units TSU_2 to TSU_6) disposed on the display panel DP. The sensor unit may include a first bridge (e.g., one of BD1_2 to BD1_6), a first insulating layer IL1, first sensor portions SP1, and a second insulating layer IL2. In some exemplary embodiments, the second insulating layer IL2 may be omitted. In addition, the sensor unit may be disposed directly on the display panel DP.

In the various exemplary embodiments of FIGS. 12A to 12E, the first bridge (e.g., one of BD1_2 to BD1_6) included in the sensor unit (e.g., one of TSU_2 to TSU_6) may include a bridge flat portion BD-FP and a bridge protrusion (e.g., one of BD-EP_2 to BD-EP_6). FIGS. 12A to 12E illustrate cases in which shapes of cross-sections of contact electrodes (e.g., one of contact electrodes CE_2 to CE_6) are different from each other on the basis of the number, a shape, and/or a position of the bridge protrusion (e.g., one of BD-EP_2 to BD-EP_6) when viewed in a cross-sectional view defined by the first and third directions DR1 and DR3. In this manner, a corresponding shape of a through-hole (e.g., one of through-holes HL_2 to HL_6) may also be different when viewed in the cross-sectional view defined by the first and third directions DR1 and DR3.

Meanwhile, FIGS. 12A to 12E illustrate various exemplary embodiments in which the shapes of the cross-section of the contact electrodes (e.g., one of contact electrodes CE_2 to CE_6) are different from each other, but the cross-sectional shape of the contact electrode is not limited to or by the shapes illustrated in FIGS. 12A to 12E. In some exemplary embodiments, the cross-section of a contact electrode may have one of other various polygonal shapes of five or more sides. In FIGS. 12A to 12E, portions corresponding to edge portions (e.g., one of ED_2 to ED_6) are represented as dots for descriptive and illustrative convenience, but real edge portions do not include such dots.

Figure 12A:
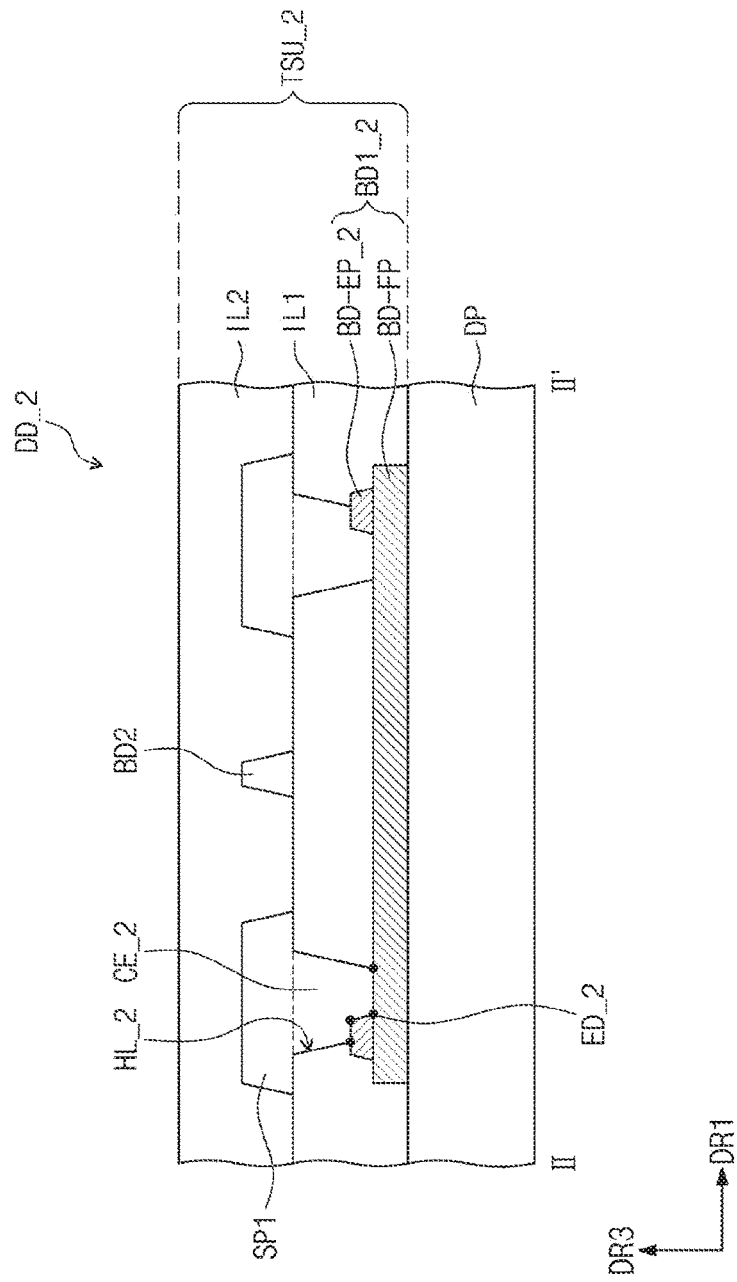

In FIG. 12A, the bridge protrusions BD-EP_2 of the display apparatus DD_2 may be disposed on an end portion and another end portion of the bridge flat portion BD-FP of the sensor unit TSU_2, respectively, and one bridge protrusion BP-EP_2 may partially overlap with the through-hole HL_2. The bridge protrusion BD-EP_2 may be disposed in such a way that a portion of a top surface and a portion of a sidewall of the bridge protrusion BD-EP_2 are disposed in the through-hole HL_2. The contact electrode CE_2 may fill a space defined by a top surface of the bridge flat portion BD-FP, the top surface and the sidewall of the bridge protrusion BD-EP_2, a sidewall of the first insulating layer IL1 defining (or including) the through-hole HL_2, and a sensor bottom surface of the first sensor portion SP1. The cross-section of the contact electrode CE_2 may have a hexagonal shape having six sides. In the embodiment of FIG. 12A, the contact electrode CE_2 may have four edge portions ED_2 in a portion being in contact with the first bridge BD1_2.

In FIG. 12B, the bridge protrusions BD-EP_3 of the display apparatus DD_3 may be disposed on each of one end portion and another end portion of the bridge flat portion BD-FP of the sensor unit TSU_3, and a plurality of the bridge protrusions BD-EP_3 may be disposed in the through-hole HL_3. As seen in FIG. 12B, three bridge protrusions BD-EP_3 are disposed in one through-hole HL_3. However, exemplary embodiments are not limited thereto or thereby. In some exemplary embodiments, two bridge protrusions BD-EP_3 may be disposed in one through-hole HL_3, or four or more bridge protrusions BD-EP_3 may be disposed in one through-hole HL_3. Meanwhile, in FIG. 12B, the bridge protrusion BD-EP_3 may be one bridge protrusion pattern which is seen as a plurality of bridge protrusions BD-EP_3 separated (or spaced apart) from each other in a cross-sectional view.

In FIG. 12B, the contact electrode CE_3 may fill a space defined by the top surface of the bridge flat portion BD-FP, top surfaces and sidewalls of the bridge protrusions BD-EP_3, the sidewall of the first insulating layer IL1 defining the through-hole HL_3, and the sensor bottom surface of the first sensor portion SP1. The cross-section of the contact electrode CE_3 may have a hexadecagon shape having sixteen sides. As seen in FIG. 12B, the contact electrode CE_3 may have fourteen edge portions ED_3 in a portion in contact with the first bridge BD1_3.

Figure 12C:
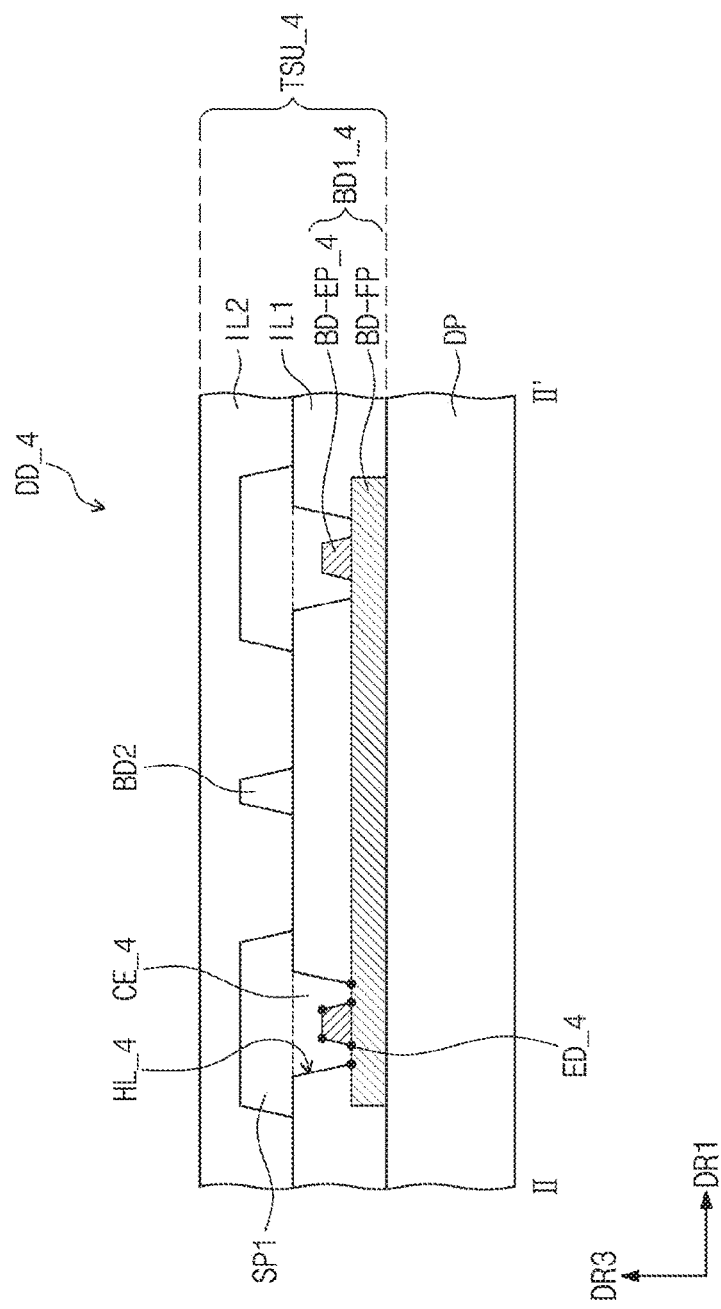

In FIG. 12C, the bridge protrusions BD-EP_4 of the display apparatus DD_4 may be disposed on an end portion and another end portion of the bridge flat portion BD-FP of the sensor unit TSU_4, respectively, and one bridge protrusion BP-EP_4 may overlap with the through-hole HL_4. The bridge protrusion BD-EP_4 may be disposed in the through-hole HL_4. The contact electrode CE_4 may fill a space defined by the top surface of the bridge flat portion BD-FP, the top surface and the sidewall of the bridge protrusion BD-EP_4, the sidewall of the first insulating layer IL1 defining the through-hole HL_4, and the sensor bottom surface of the first sensor portion SP1. The cross-section of the contact electrode CE_4 may have an octagonal shape having eight sides. As seen in FIG. 12C, the contact electrode CE_4 may have six edge portions ED_4 in a portion in contact with the first bridge BD1_4.

In FIG. 12D, the bridge protrusions BD-EP_5 of the display apparatus DD_5 may be disposed on an end portion and another end portion of the bridge flat portion BD-FP of the sensor unit TSU_5, respectively, and a portion of a sidewall and a portion of a top surface of the bridge protrusion BD-EP_5 may be disposed in the through-hole HL_5. The sidewall of the bridge protrusion BD-EP_5 disposed in the through-hole HL_5 may have a step-shaped cross-section. The contact electrode CE_5 may fill a space defined by the top surface of the bridge flat portion BD-FP, the top surface and the sidewall of the bridge protrusion BD-EP_5, the sidewall of the first insulating layer IL1 defining the through-hole HL_5, and the sensor bottom surface of the first sensor portion SP1. The cross-section of the contact electrode CE_5 may have a dodecagonal shape having twelve sides. As seen in FIG. 12D, the contact electrode CE_5 may have ten edge portions ED_5 in a portion in contact with the first bridge BD1_5.

Figure 12E:
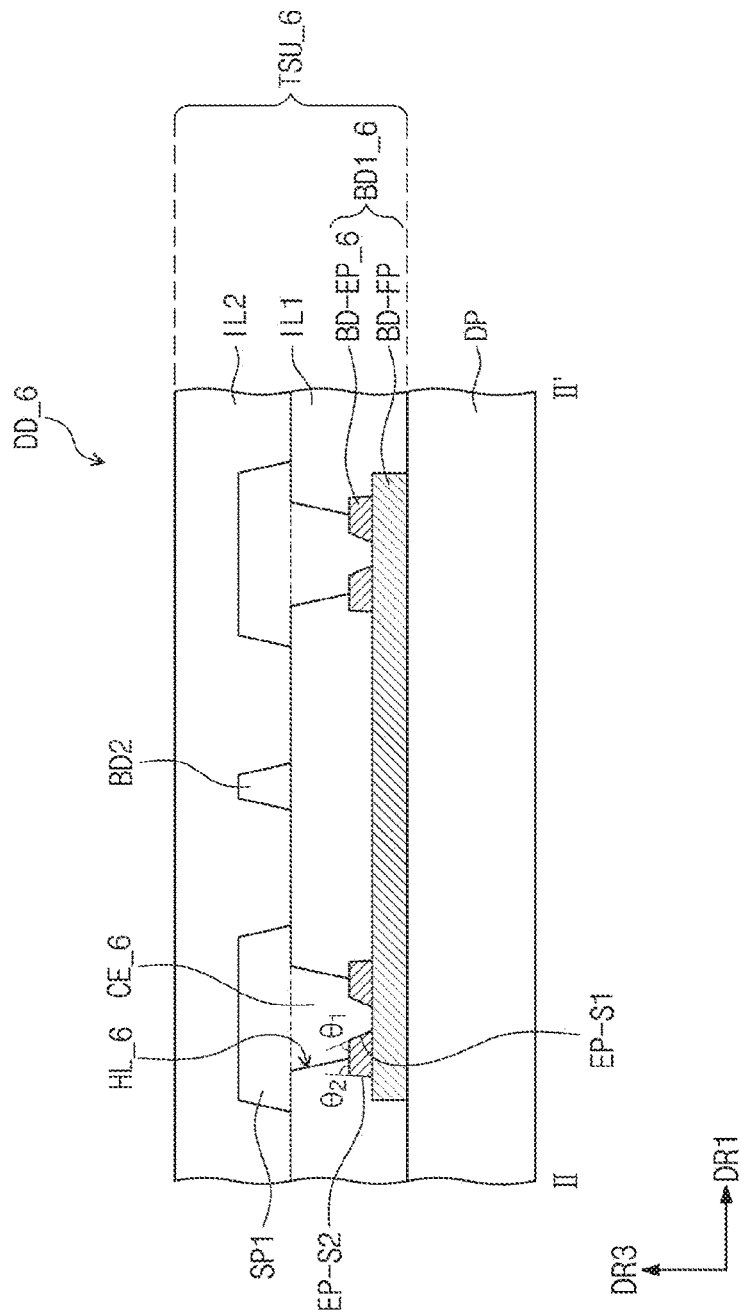

In FIG. 12E, the bridge protrusions BD-EP_6 of the display apparatus DD_6 may be disposed on an end portion and another end portion of the bridge flat portion BD-FP of the sensor unit TSU_6, respectively, and a portion of a sidewall and a portion of a top surface of the bridge protrusion BD-EP_6 may be disposed in the through-hole HL_6. As seen in FIG. 12E, the bridge protrusion BD-EP_6 may have an inner sidewall EP-S1 disposed in the through-hole HL_6 and an outer sidewall EP-S2 disposed outside the through-hole HL_6. An inclination angle of the inner sidewall EP-S1 may be different from an inclination angle of the outer sidewall EP-S2. In other words, the inclination angle $\theta_1$ of the inner sidewall EP-S1 with respect to the bridge flat portion BD-FP may be different from the inclination angle $\theta_2$ of the outer sidewall EP-S2 with respect to the bridge flat portion BD-FP. The inclination angle $\theta_1$ of the inner sidewall EP-S1 may be less than the inclination angle $\theta_2$ of the outer sidewall EP-S2. When the inclination angle $\theta_1$ of the inner sidewall EP-S1 is less than the inclination angle $\theta_2$ of the outer sidewall EP-S2, a contact area between the contact electrode CE_6 and the first bridge BD1_6 may be further increased.

Figure 13A:
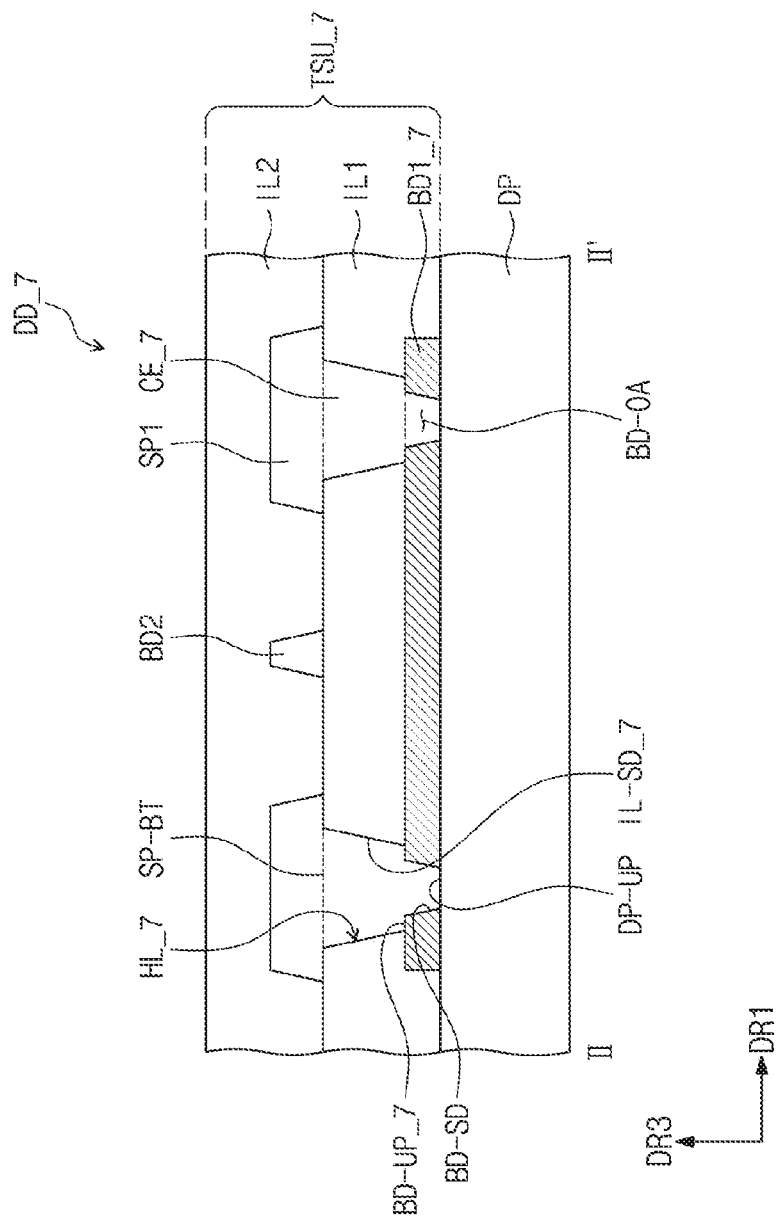
FIGS. 13A and 13B are cross-sectional views illustrating contact electrodes included in display apparatuses according to some exemplary embodiments.
Figure 13B:
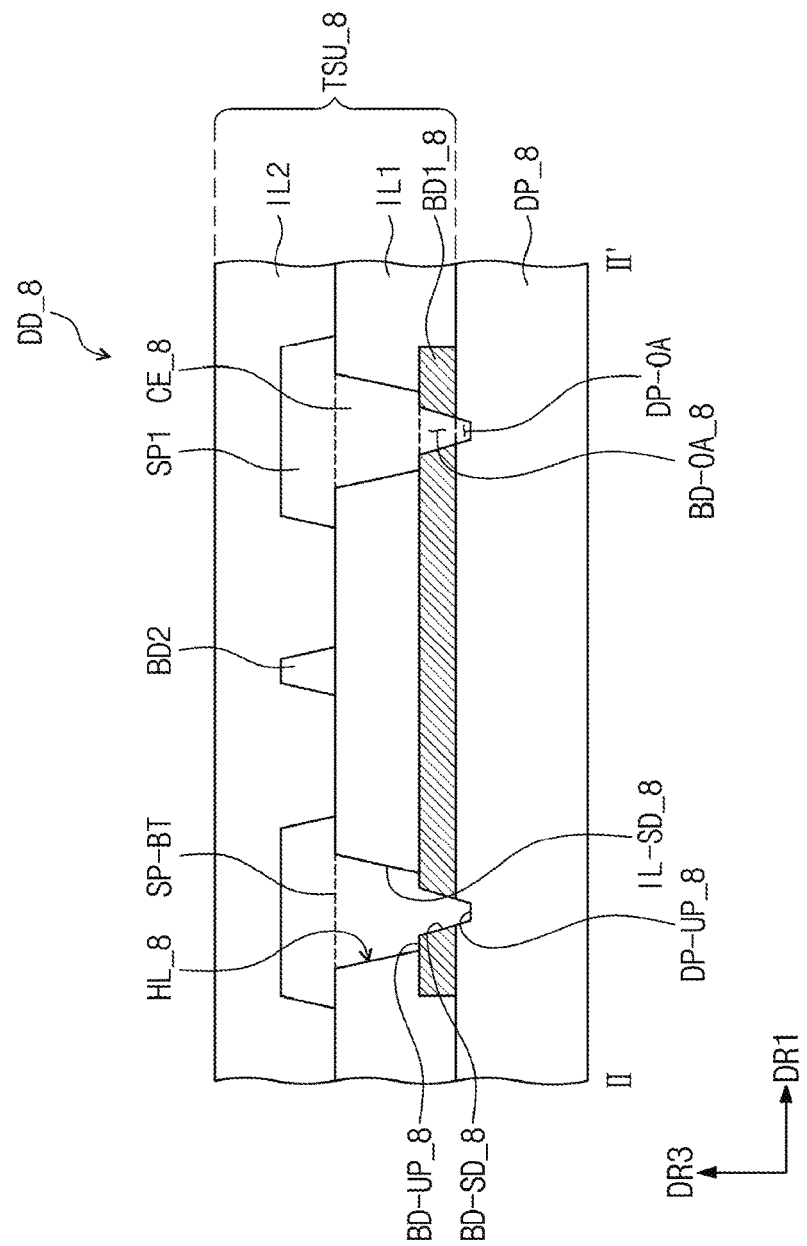

FIGS. 13A and 13B are cross-sectional views illustrating contact electrodes included in display apparatuses according to some exemplary embodiments. The cross-sectional views of FIGS. 13A and 13B may be taken along the sectional line II-II' of FIG. 4. In other words, FIGS. 13A and 13B are cross-sectional views, each of which illustrates two first sensor portions SP1 adjacent to each other, a first bridge (e.g., one of first bridges BD1_7 and BD1_8) electrically connecting the two first sensor portions SP1, and contact electrodes (e.g., one of contact electrodes CE7 and CE8) electrically connecting the first bridge (e.g., one of first bridge BD1_7 and BD1_8) to the first sensor portions SP1. In FIGS. 13A and 13B, the descriptions of the same (or similar) elements as previously described in connection with FIGS. 1 to 11 will be omitted or mentioned briefly for convenience and to avoid obscuring exemplary embodiments. In other words, primarily differences will be described below, and similarly configured elements are similarly referenced in the corresponding figures.

As seen in FIGS. 13A and 13B, the first bridge BD1_7 or BD1_8 of the sensor unit TSU_7 or TSU_8 may include a bridge concave portion BD-OA or BD-OA_8 exposing the top surface of the display panel DP or DP_8. A cross-section of each of the contact electrodes CE_7 or CE_8 of the sensor unit TSU_7 or TSU_8 may have a polygonal shape that is defined by an exposed top surface DP-UP or DP-UP_8 of the display panel DP or DP_8, a bridge sidewall BD-SD or BD-SD_8 of the first bridge BD1_7 or BD1_8 defining the bridge concave portion BD-OA or BD-OA_8, a bridge top surface BD-UP_7 or BD-UP_8 of the first bridge BD1_7 or BD1_8 disposed in the through-hole HL_7 or HL_8, an insulating sidewall IL-SD_7 or IL-SD_8 of the first insulating layer IL1 defining the through-hole HL_7 or HL_8, and a sensor bottom surface SP-BT of the first sensor portion SP1. The cross-section of the contact electrode CE_7 or CE_8 may have a polygonal shape having five or more sides.

The first bridge BD1_7 or BD1_8 may define the bridge concave portion BD-OA or BD-OA_8 exposing the top surface of the display panel DP or DP_8 in an overlapping portion with the first sensor portion SP1. The bridge concave portion BD-OA or BD-OA_8 may be defined to be disposed in the through-hole HL_7 or HL_8 defined by the first insulating layer IL1. As seen in FIG. 13A, one bridge concave portion BD-OA is defined in one through-hole HL_7. However, exemplary embodiments are not limited thereto or thereby. In some exemplary embodiments, the first bridge BD1_7 or BD1_8 may include a plurality of bridge concave portions BD-OA or BD-OA_8 disposed in one through-hole HL_7 or HL_8.

In FIG. 13A, the cross-section of the contact electrode CE_7 or CE_8 may have an octagonal shape having eight sides. Although not clearly shown in the drawings, the cross-section of the contact electrode CE_7 or CE_8 may have six edge portions.

Referring to FIG. 13B, the display apparatus DD_8 may further include a recessed portion DP-OA formed in the top surface of the display panel DP_8 as compared with the display apparatus DD_7 of FIG. 13A. The recessed portion DP-OA may be provided in the top surface of the display panel DP_8 at a position corresponding to the bridge concave portion BD-OA_8. In FIG. 13B, the contact electrode CE_8 may fill a space defined by a top surface DP-UP_8 of the display panel DP_8 exposed by the recessed portion DP-OA_8, a sidewall of the recessed portion DP-OA_8, the bridge sidewall BD-SD_8 of the first bridge BD1_8 defining the bridge concave portion BD-OA_8, the insulating sidewall IL-SD_8 of the first insulating layer IL1 defining the through-hole HL_8, and the sensor bottom surface SP-BT of the first sensor portion SP1. As seen in FIG. 13B, the cross-section of the contact electrode CE_8 may have an octagonal shape having eight sides.

The various display apparatuses illustrated in FIGS. 5, 12A to 12E, 13A, and 13B may include a display panel and a sensor unit disposed on the display panel. In some exemplary embodiments, the sensor unit may include a first conductive layer including a first bridge, an insulating layer disposed on the first conductive layer and defining a through-hole, a second conductive layer disposed on the insulating layer and including first sensor portions, and a contact electrode filling the through-hole.

The first bridge may have at least one uneven portion. The at least one uneven portion may be a concave portion or a protrusion. For example, the uneven portion may be the protrusion corresponding to the bridge protrusion BD-EP in FIG. 5 or the concave portion corresponding to the bridge concave portion BD-OA in FIG. 13A. The protrusion or the concave portion, which is the uneven portion, may have a trapezoid-shaped cross-section perpendicular to the top surface of the display panel. For example, the cross-section of the uneven portion may have a trapezoid shape in which a width of a portion adjacent to the display panel is smaller than a width of another portion adjacent to the first sensor portion SP1.

The insulating layer may correspond to the first insulating layer IL1. The through-hole defined in the first insulating layer IL1 may overlap with the uneven portion. The uneven portion may be disposed in the through-hole. When the uneven portion is provided in plurality, a portion of the uneven portions may be disposed in the through-hole.

The second conductive layer disposed on the insulating layer may include the first sensor portion SP1, and the first sensor portion SP1 may overlap with the uneven portion and the through-hole. In addition, the contact electrode may be disposed on the uneven portion and may fill the through-hole. The contact electrode may be disposed on the uneven portion and may be disposed between the first sensor portion SP1 and the first bridge. The contact electrode may electrically connect the first sensor portion SP1 to the first bridge.

According to various exemplary embodiments, the contact electrode connecting two conductive layers disposed in different layers has been described above. However, exemplary embodiments are not limited thereto or thereby. In some exemplary embodiments, the display apparatus may include three or more conductive layers, and the contact electrode included in the sensor unit according to some exemplary embodiments may be applied to contact electrodes connecting metal patterns disposed in different conductive layers. In other words, the contact electrode connecting the metal patterns provided in different layers may include a cross-section that has a polygonal shape of five or more sides.

In the display apparatus of each of FIGS. 5, 12A to 12E, 13A, and 13B, each of the layers included in the sensor unit may be formed using a photolithography process. The first bridge may be formed on the display panel by a patterning process. At this time, the top surface of the display panel on which the patterning process of the first bridge is performed may be the sealing layer TFE (see FIG. 2). The first bridge may be patterned to have the uneven portion. For example, the first bridge may be patterned to have the bridge flat portion BD-FP and the bridge protrusion BD-EP, as illustrated in FIG. 5. Alternatively, the first bridge BD1_7 may be patterned to have the bridge concave portion BD-OA, as illustrated in FIG. 13A. In other words, the first bridge may be patterned to have at least one uneven portion, and the at least one uneven portion may be the protrusion or the concave portion.

The uneven portion of the first bridge may be formed using two photolithography processes or may be formed by a single photolithography process using a half-tone mask. On the other hand, the bridge flat portion BD-FP and the bridge protrusion of the first bridge may be formed of different metal materials that have different etch rates from each other in an etching process. Alternatively, the bridge flat portion BD-FP and the bridge protrusion may be formed of the same metal material.

Thereafter, the first insulating layer IL1 is provided on the top surface of the display panel. The first insulating layer IL1 may be disposed to surround the first bridge. The first insulating layer IL1 may be patterned to have the through-hole.

Next, the first sensor portions SP1, the second sensor portions SP2, and the second bridge BD2 that constitute the second conductive layer may be formed on the first insulating layer IL1 having the through-hole by a patterning process. At this time, the contact electrode may be formed to fill the through-hole on the uneven portion of the first bridge. After the formation of the first and second sensor portions SP1 and SP2 and the second bridge BD2 of the second conductive layer, the second insulating layer IL2 may be provided to surround the first sensor portions SP1, the second sensor portions SP2, and the second bridge BD2.

The aforementioned method of providing the sensor unit is described as merely an example. However, exemplary embodiments are not limited to or by the above method of providing the sensor unit.

According to various exemplary embodiments, a display apparatus may include a sensor unit including a contact electrode having a polygon-shaped cross-section, and, thus, the contact resistance of the contact electrode in the sensor unit may be reduced to improve electrical characteristics of the display apparatus. The contact electrode connecting the sensor portion and the bridge in the sensor unit may have the polygon-shaped cross-section, and, thus, the contact area of the contact electrode and the first bridge may be increased. In addition, the number of the edge portions in a contact portion of the contact electrode and the first bridge may be increased to reduce the contact resistance in the sensor unit. As such, a display apparatus according to various exemplary embodiments may include a contact electrode that increases the contact area with the first bridge, and, thus, a contact resistance of the sensor unit may be reduced.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display apparatus comprising:
   a display panel; and
   a sensor unit disposed on the display panel,
   wherein the sensor unit comprises:
      a first conductive layer comprising a first bridge;
      a second conductive layer disposed on the first conductive layer, the second conductive layer comprising first sensor portions spaced apart from each other and arranged in a first direction;
      a first insulating layer disposed between the first conductive layer and the second conductive layer, the first insulating layer comprising through-holes extending between the first bridge and the first sensor portions overlapping the first bridge; and
      contact electrodes filling spaces defined by a bridge top surface of the first bridge exposed by the through-holes, insulating sidewalls of the first insulating layer defining the through-holes, and sensor bottom surfaces of the first sensor portions facing the first bridge, and
   wherein a cross-section, which is perpendicular to a top surface of the display panel, of each of the contact electrodes has a polygonal shape of five or more sides.

2. The display apparatus of claim 1, wherein the second conductive layer further comprises:
   second sensor portions spaced apart from each other and arranged in a second direction intersecting the first direction; and
   a second bridge connecting adjacent second sensor portions among the second sensor portions.

3. The display apparatus of claim 2, wherein each of the first bridge, the first sensor portions, the second bridge, the second sensor portions, and the contact electrodes comprises a multi-layered electrode layer formed of two or more metal layers.

4. The display apparatus of claim 1, wherein:
   the display panel comprises:
      a base substrate;
      a circuit layer disposed on the base substrate;
      a light-emitting device layer disposed on the circuit layer; and
      a sealing layer disposed on the light-emitting device layer; and
   the first conductive layer is disposed directly on the sealing layer.

5. The display apparatus of claim 1, wherein the first bridge comprises:
a bridge flat portion extending in the first direction; and
a bridge protrusion disposed on the bridge flat portion.

6. The display apparatus of claim 5, wherein the polygonal shape is defined by a top surface of the bridge flat portion, a sidewall and a top surface of the bridge protrusion, an insulating sidewall among the insulating sidewalls, and a sensor bottom surface among the sensor bottom surfaces.

7. The display apparatus of claim 6, wherein:
the bridge protrusion is disposed on an end portion of the bridge flat portion; and
a portion of the sidewall and a portion of the top surface of the bridge protrusion are disposed in a through-hole among the through-holes.

8. The display apparatus of claim 6, wherein:
the bridge protrusion is one of a plurality of bridge protrusions;
first bridge protrusions among the plurality of bridge protrusions are disposed on a first end portion of the bridge flat portion;
second bridge protrusions among the plurality of bridge protrusions are disposed on a second end portion of the bridge flat portion, the second end portion opposing the first end portion; and
a portion of a sidewall and a portion of a top surface of each of the plurality of bridge protrusions are disposed in a corresponding through-hole among the through-holes.

9. The display apparatus of claim 5, wherein the bridge flat portion and the bridge protrusion comprise different conductive metals.

10. The display apparatus of claim 1, wherein the first bridge comprises a bridge concave portion exposing the top surface of the display panel.

11. The display apparatus of claim 10, wherein the polygonal shape is defined by the exposed top surface of the display panel, a sidewall of the first bridge defining the bridge concave portion, the bridge top surface, an insulating sidewall among the insulating sidewalls, and a sensor bottom surface among the sensor bottom surfaces.

12. The display apparatus of claim 10, wherein the bridge concave portion is defined in a through-hole among the through-holes.

13. The display apparatus of claim 10, wherein the display panel comprises a recessed portion disposed at a position corresponding to the bridge concave portion.

14. The display apparatus of claim 13, wherein the polygonal shape is defined by a top surface of the display panel exposed by the recessed portion, a sidewall of the first bridge defining the bridge concave portion, the bridge top surface, an insulating sidewall among the insulating sidewalls, and a sensor bottom surface among the sensor bottom surfaces.

15. The display apparatus of claim 1, wherein the sensor unit further comprises a second insulating layer disposed on the second conductive layer.

16. The display apparatus of claim 1, wherein adjacent first sensor portions among the first sensor portions are electrically connected to each other through the first bridge and the contact electrodes.

17. A display apparatus comprising:
a display panel; and
a sensor unit disposed on the display panel,
wherein the sensor unit comprises:
a first conductive layer comprising a first bridge, the first bridge comprising at least one uneven portion;
an insulating layer disposed on the first conductive layer, the insulating layer comprising a through-hole overlapping the at least one uneven portion;
a second conductive layer disposed on the insulating layer, the second conductive layer comprising a first sensor portion overlapping the at least one uneven portion and the through-hole; and
a contact electrode disposed on the at least one uneven portion, the contact electrode filling the through-hole.

18. The display apparatus of claim 17, wherein the at least one uneven portion is a concave portion or a protrusion.

19. The display apparatus of claim 18, wherein a cross-section, which is perpendicular to a top surface of the display panel, of the concave portion or protrusion has a trapezoidal shape.

20. The display apparatus of claim 18, wherein:
the first sensor portion is one of a plurality of first sensor portions;
the plurality of first sensor portions are spaced apart from each other and are arranged in a first direction; and
the second conductive layer further comprises:
second sensor portions spaced apart from each other and arranged in a second direction intersecting the first direction; and
a second bridge connecting adjacent second sensor portions among the second sensor portions.

* * * * *